United States Patent
Kim et al.

(10) Patent No.: US 10,833,047 B2
(45) Date of Patent: Nov. 10, 2020

(54) APPARATUSES OF BONDING SUBSTRATES AND METHODS OF BONDING SUBSTRATES

(71) Applicant: Samsung Electronics Co., Ltd., Suwon-si, Gyeonggi-do (KR)

(72) Inventors: Hoe Chul Kim, Hwaseong-si (KR); Dong Eog Kim, Hwaseong-si (KR); Tae Yeong Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/354,359

(22) Filed: Mar. 15, 2019

(65) Prior Publication Data
US 2020/0152596 A1    May 14, 2020

(30) Foreign Application Priority Data
Nov. 13, 2018 (KR) .......................... 10-2018-0138916

(51) Int. Cl.
*H01L 23/00* (2006.01)

(52) U.S. Cl.
CPC .............. *H01L 24/75* (2013.01); *H01L 24/83* (2013.01); *H01L 2224/7555* (2013.01); *H01L 2224/7592* (2013.01); *H01L 2224/83201* (2013.01)

(58) Field of Classification Search
None
See application file for complete search history.

(56) References Cited

U.S. PATENT DOCUMENTS

| | | | |
|---|---|---|---|
| 7,948,034 B2 | 5/2011 | George et al. | |
| 8,822,307 B2 * | 9/2014 | Yamaguchi | H01L 21/67092 156/358 |
| 9,498,944 B2 | 11/2016 | Izumi | |
| 9,741,595 B2 | 8/2017 | Sugakawa et al. | |
| 2003/0226633 A1 * | 12/2003 | Muramoto | B32B 37/10 156/145 |
| 2013/0082727 A1 | 4/2013 | Matsumura | |
| 2016/0336203 A1 | 11/2016 | Lindner | |
| 2018/0158796 A1 * | 6/2018 | Otsuka | H01L 21/2007 |

FOREIGN PATENT DOCUMENTS

| | | |
|---|---|---|
| KR | 101278703 B1 | 6/2013 |
| KR | 101375097 B1 | 3/2014 |
| KR | 2015-0090494 A | 8/2015 |
| KR | 101809760 B1 | 12/2017 |

* cited by examiner

*Primary Examiner* — Robert K Carpenter
(74) *Attorney, Agent, or Firm* — Harness, Dickey & Pierce, P.L.C.

(57) ABSTRACT

A substrate bonding apparatus includes a lower chuck, an upper chuck, an electric actuator on a central portion of the upper chuck, a pressure sensor, and a controller. The lower chuck may support a lower substrate, the upper chuck may face the lower chuck such that a lower surface of the upper chuck faces the upper surface of the lower chuck, and the upper chuck may support an upper substrate. The electric actuator may lower a bonding pin through the upper chuck to apply a pressure to the upper substrate supported on the upper chuck. The pressure sensor may be below the lower substrate supported on the lower chuck. The pressure sensor may sense a lowering pressure applied by the bonding pin to the pressure sensor in real time. The controller may control the lowering pressure applied by the bonding pin.

15 Claims, 13 Drawing Sheets

APPARATUSES OF BONDING SUBSTRATES AND METHODS OF BONDING SUBSTRATES

CROSS-REFERENCE TO RELATED APPLICATION

This application claims priority to and the benefit of, under 35 U.S.C. § 119, Korean Patent Application No. 10-2018-0138916, filed on Nov. 13, 2018, the disclosure of which is incorporated herein by reference in its entirety.

BACKGROUND

1. Field

Example embodiments relate to substrate bonding apparatuses and substrate bonding methods.

2. Description of Related Art

A great amount of research for multifunction and light-weighting, thinning, shortening, and miniaturization of electronic devices is underway. Semiconductor devices used in electronic devices include various types of unit elements that perform different functions. There have been attempts to form a different semiconductor chips having different, respective unit elements and to bond the different semiconductor chips together. In some cases, two sheets of wafers may be bonded using a pneumatic bonding apparatus. In substrate bonding methods using some pneumatic bonding apparatus, it is difficult to precisely control a lowering pressure, speed, and distance applied to a bonding pin and it is difficult to uniformly maintain the bonding quality of substrates.

SUMMARY

The example embodiments of the inventive concepts are directed to providing substrate bonding apparatuses and substrate bonding methods for precisely controlling a lowering pressure, speed, and distance of a bonding pin.

The example embodiments of the inventive concepts are directed to providing substrate bonding apparatuses and substrate bonding methods for ensuring reproducibility of substrate bonding.

According to some example embodiments, a substrate bonding apparatus may include a lower chuck, an upper chuck, an electric actuator on a central portion of the upper chuck, a first pressure sensor at a side portion of the lower chuck, and a controller. The lower chuck may be configured to support a lower substrate on an upper surface of the lower chuck. The upper chuck may be configured to face the lower chuck such that a lower surface of the upper chuck faces the upper surface of the lower chuck. The upper chuck may be configured to support an upper substrate on the lower surface of the upper chuck. The electric actuator may be configured to lower a bonding pin through the upper chuck to apply a pressure to the upper substrate supported on the lower surface of the upper chuck. The first pressure sensor may be configured to sense a lowering pressure applied by the bonding pin to the first pressure sensor prior to the lower substrate and the upper substrate being bonded together. The controller may be configured to control the lowering pressure applied by the bonding pin.

According to some example embodiments, a substrate bonding apparatus may include a lower chuck, an upper chuck, an electric actuator on a central portion of the upper chuck, a pressure sensor, and a controller. The lower chuck may be configured to support a lower substrate on an upper surface of the lower chuck. The upper chuck may be configured to face the lower chuck such that a lower surface of the upper chuck faces the upper surface of the lower chuck. The upper chuck may be configured to support an upper substrate on the lower surface of the upper chuck. The electric actuator may be configured to lower a bonding pin through the upper chuck to apply a pressure to the upper substrate supported on the lower surface of the upper chuck. The pressure sensor may be at a central portion of the lower chuck such that the pressure sensor is below the upper surface of the lower chuck and is configured to be below the lower substrate supported on the upper surface of the lower chuck. The pressure sensor may be configured to sense a lowering pressure applied by the bonding pin to the pressure sensor in real time. The controller may be configured to control the lowering pressure applied by the bonding pin.

According to some example embodiments, a substrate bonding method may include loading a lower substrate on an upper surface of a lower chuck, loading an upper substrate on a lower surface of an upper chuck, the lower surface of the upper chuck facing the upper surface of the lower chuck, driving an electric actuator at a center portion of the upper chuck to lower a bonding pin through the upper chuck towards the lower chuck, separating a central portion of the upper substrate from the upper chuck, such that the upper substrate is brought into contact with the lower substrate, based on a pressure applied by the bonding pin to the upper substrate, causing the bonding pin to apply a constant pressure to bond the upper substrate to the lower substrate, sensing, by a pressure sensor at a central portion of the lower chuck such that the pressure sensor is below the upper surface of the lower chuck and is configured to be below the lower substrate supported on the upper surface of the lower chuck, a pressure applied by the bonding pin to the pressure sensor when the lower substrate and the upper substrate are bonded, in real time and generating a first pressure sensing signal based on the sensing, and receiving, by a controller, the first pressure sensing signal and adjusting a lowering pressure applied by the bonding pin based on the first pressure sensing signal when subsequent substrates are bonded.

DETAILED DESCRIPTION

Hereinafter, substrate bonding apparatuses, substrate bonding method, and a semiconductor device, which is manufactured by the substrate bonding apparatus and method, will be described with reference to the accompanying drawings.

Figure 1:
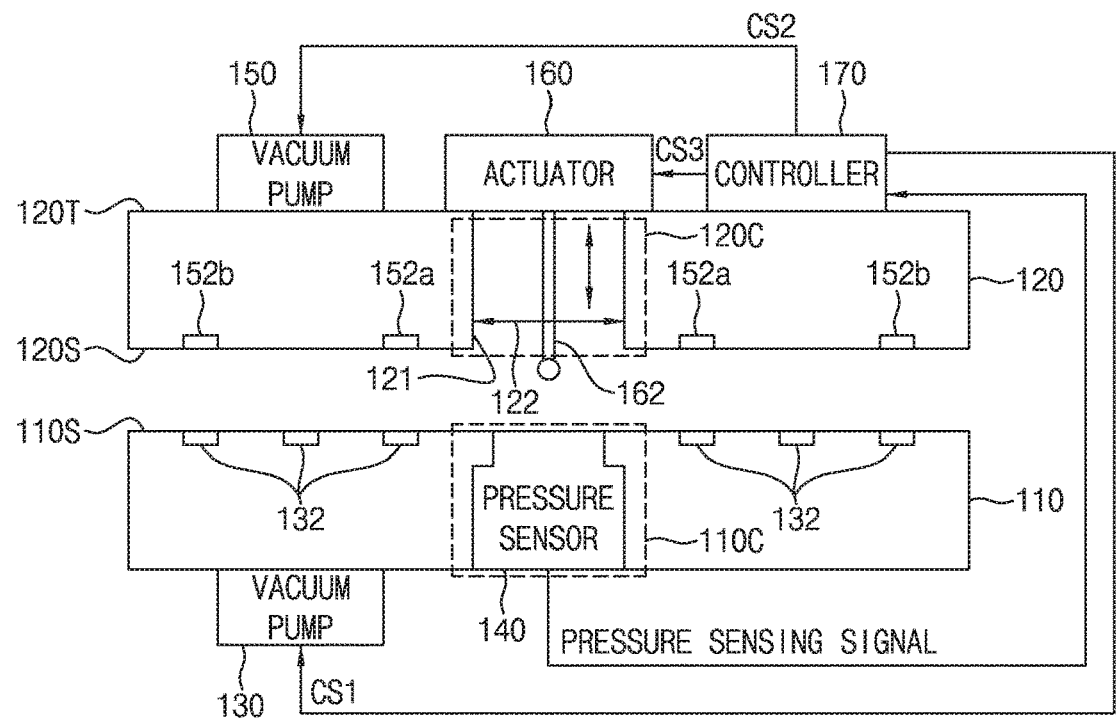
FIG. 1 is a view showing a substrate bonding apparatus according to some example embodiments of the inventive concepts.
Figure 2:
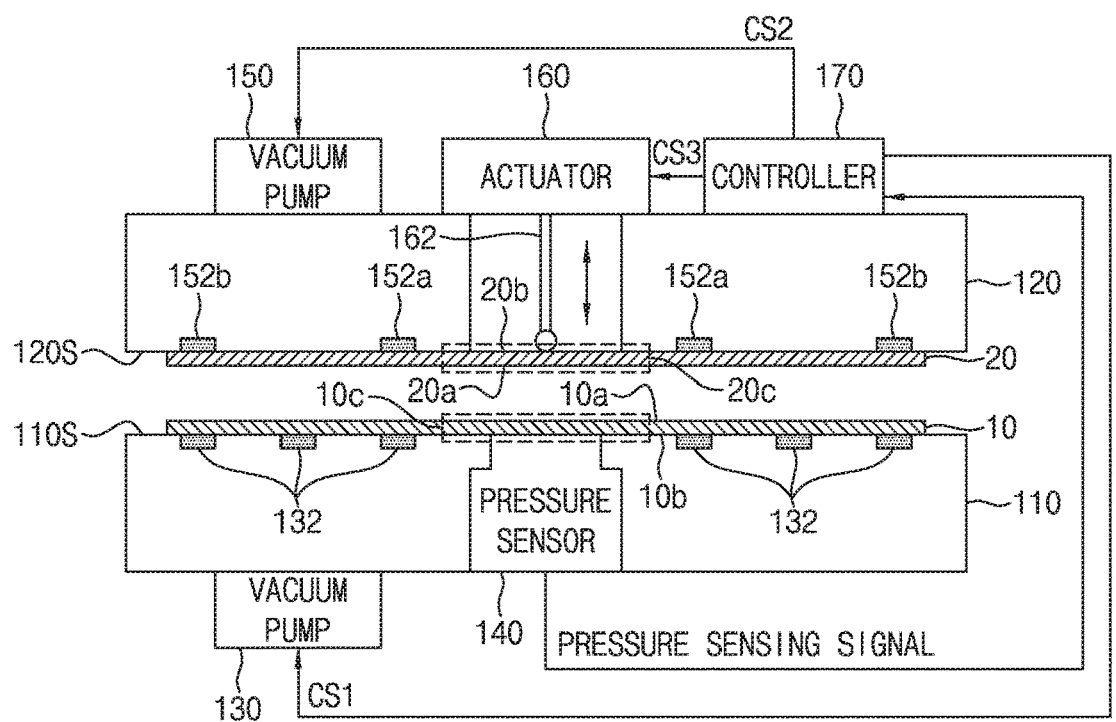
FIG. 2 is a view showing the substrate bonding apparatus on which a lower substrate and an upper substrate are loaded.

FIG. 1 is a view showing a substrate bonding apparatus according to some example embodiments of the inventive concepts. FIG. 2 is a view showing the substrate bonding apparatus on which a lower substrate and an upper substrate are loaded.

Referring to FIGS. 1 and 2, a substrate bonding apparatus 100 according to some example embodiments of the inventive concepts include a lower chuck 110, an upper chuck 120, a lower vacuum pump 130, a pressure sensor 140, an upper vacuum pump 150, an electric actuator 160, and a controller 170. The lower chuck 110 and the upper chuck 120 may be disposed to face each other, such that a lower surface 120S of the upper chuck 120 faces an upper surface 110S of the lower chuck 110.

As shown in FIGS. 1-2, the lower chuck 110 may be configured to support a lower substrate 10 on the upper surface 110S of the lower chuck 110. A plurality of lower vacuum suction holes 132 may be formed in the lower chuck 110 to fix a lower substrate 10 which is disposed on an upper surface of the lower chuck 110. The number of the lower vacuum suction holes 132 may vary according to a size of the lower substrate 10. Each of the plurality of lower vacuum suction holes 132 may be connected to the lower vacuum pump 130 through a connection pipe (not shown). When the lower vacuum pump 130 is driven in response to a first control signal CS1 input from the controller 170, air above the lower chuck 110 may be suctioned through the plurality of lower vacuum suction holes 132. Since the air above the lower chuck 110 is suctioned, the lower substrate 10 which is disposed on the upper surface of the lower chuck 110 may be fixed. Restated, the lower chuck 110 may include a plurality of lower vacuum suction holes 132, and the substrate bonding apparatus 100 may include a lower vacuum pump 130 connected to the plurality of lower vacuum suction holes 132 and configured to draw air towards the lower vacuum pump 130 through the lower vacuum suction holes 132 to fix the lower substrate 10 on the upper surface 110S of the lower chuck 110.

A plurality of upper vacuum suction holes 152a and 152b may be formed in the upper chuck 120 to fix an upper substrate 20 which is disposed on a lower surface of the upper chuck 120. Restated, the upper chuck 120 may be configured to support an upper substrate 20 on the lower surface 120S of the upper chuck 120. The plurality of upper vacuum suction holes 152a and 152b may include first upper vacuum suction holes 152a formed to correspond to a central portion 20C of the upper substrate 20 and second upper vacuum suction holes 152b formed to correspond to an outer portion of the upper substrate 20. The number of the first upper vacuum suction holes 152a and the number of the second upper vacuum suction holes 152b may vary according to a size of the upper substrate 20. Each of the plurality of upper vacuum suction holes 152a and 152b may be connected to the upper vacuum pump 150 through a connection pipe (not shown). Restated, the upper chuck 120 may include a plurality of upper vacuum suction holes 152a-152b, and the substrate bonding apparatus 100 may include an upper vacuum pump 150 connected to the plurality of upper vacuum suction holes 152a-152b and configured to draw air towards the upper vacuum pump 150 through the upper vacuum suction holes 152a-152b to fix the upper substrate 20 on the lower surface 120S of the upper chuck 120.

As one example, the air may be suctioned simultaneously through the first upper vacuum suction holes 152a and the second upper vacuum suction holes 152b. As one example, the air may be suctioned through the second upper vacuum suction holes 152b without being suctioned through the first upper vacuum suction holes 152a. A plurality of valves (e.g., throttle valves) capable of turning on/off suction of air may be disposed between the upper vacuum pump 150 and the plurality of connection pipes. The controller 170 may control the plurality of valves individually while the upper vacuum pump 150 is driven. The air suction using the first upper vacuum suction holes 152a and the second upper vacuum suction holes 152b may be individually controlled by turning the plurality of valves on/off. When the upper vacuum pump 150 is driven in response to a second control signal CS2 input from the controller 170, air below the upper chuck 120 may be suctioned through the plurality of upper vacuum suction holes 152a and 152b. Since the air below the upper chuck 120 may be suctioned, the upper substrate 20 which is disposed on the lower surface of the upper chuck 120 may be fixed.

The lower chuck 110 and the upper chuck 120 are shown and described above as being vacuum chucks using suction of air. The inventive concepts are not limited thereto, and electrostatic chucks (ESCs) that pull substrates with an electrostatic force may be applied to the lower chuck 110 and the upper chuck 120.

As shown in at least FIGS. 1-2, the electric actuator 160 may be on an upper surface 120T of the upper chuck 120. As further shown in FIGS. 1-2, the electric actuator 160 may be on a central portion 120C of the upper chuck 120. The central portion 120C of the upper chuck 120 may include one or more inner surfaces 121 that define a conduit 122 extending through the upper chuck 120 between the upper surface 120T and the lower surface 120S thereof, and the electric actuator 160 may be on the central portion 120C of the upper chuck 120 such that the electric actuator 160 is aligned with the conduit 122 in the vertical direction (e.g., the direction extending perpendicular to the upper surface 110S of the lower chuck 110). The electric actuator 160 may be driven in response to a third control signal CS3 input from the controller 170. A motor driven by electricity may be applied to the electric actuator 160, and a bonding pin 162 may be connected to the electric actuator 160. The bonding pin 162 may be lowered and raised by the driving of the electric actuator 160. As shown in FIGS. 1-2, the electric actuator 160 may be configured to lower and/or raise the bonding pin 162 through the conduit 122, such that the electric actuator 160 may lower and/or raise the bonding pin 162 through the upper chuck 120, such that the bonding pin 162 may be lowered through the upper chuck 120 to apply a pressure to the upper substrate 20 supported on the lower surface 120S of the upper chuck 120, based on the bonding pin 162 being lowered into direct contact with the upper substrate 20 by the electric actuator 160. A lowering distance of the bonding pin 162 may be finely adjusted in units of 1 μm to 1 mm by the driving of the electric actuator 160. A pressure applied to the upper substrate 20 by the bonding pin 162 may be finely adjusted in units of 1 mbar by the driving of the electric actuator 160. Restated, the electric actuator 160 may be configured to lower the bonding pin 162 through the upper chuck 120 to apply pressure to the upper substrate 20 supported on the lower surface 120S of the upper chuck 120.

The bonding pin 162 may be disposed to correspond to the central portion 120C of the upper substrate 20. When the bonding pin 162 is lowered, the pressure may be applied to the upper substrate 20 disposed on the lower surface 120S of the upper chuck 120 so that the upper substrate 20 may be pushed toward the lower substrate 10.

As shown in FIGS. 1-2, the pressure sensor 140 may be disposed to correspond to a central portion 110C of the lower chuck 110, that is, a central portion 10C of the lower substrate 10, where the central portion 110C of the lower chuck 110 may be aligned with the central portion 120C of the upper chuck 120 in the vertical direction such that the pressure sensor 140 may be aligned with the conduit 122 and the bonding pin 162 in the vertical direction. The pressure sensor 140 may be disposed below the lower substrate 10 and may sense a pressure, which is applied when the lower substrate 10 and the upper substrate 20 are bonded (e.g., a pressure applied by the bonding pin 162 to at least the pressure sensor 140 through at least the upper substrate 20 and the lower substrate 10), in real time. Restated, and as shown in FIGS. 1-2, the pressure sensor 140 may be at a central portion 110C of the lower chuck 110 such that the pressure sensor 140 is at least partially below the upper surface 110S of the lower chuck 110 and is configured to be below the lower substrate 10 supported on the upper surface 110S of the lower chuck 110. In some example embodiments, including the example embodiments shown in FIGS. 1-2, an upper surface 140S of the pressure sensor 140 may be exposed by the lower chuck 110, such that the upper surface 140S of the pressure sensor 140 that is at least partially below the upper surface 110S of the lower chuck and the upper surface 110S collectively define a common, coplanar or substantially coplanar surface (e.g., coplanar within manufacturing tolerances and/or material tolerances) that may support the lower substrate 10. The pressure sensor 140 may be configured to sense a lowering pressure applied by the bonding pin 162 to at least the pressure sensor 140 (e.g., through the upper substrate 20 and the lower substrate 10) in real time. As shown in at least FIGS. 5-6, the lowering pressure applied ("exerted") by the bonding pin 162 may be transmitted through the upper substrate 20 and the lower substrate 10 to the pressure sensor 140. The pressure sensor 140 may convert the sensed pressure into an electrical signal (e.g., a pressure sensing signal) indicating a magnitude of the sensed lowering pressure. The pressure sensor 140 may generate a pressure sensing signal on the basis of the sensed pressure. The pressure sensor 140 may generate the pressure sensing signal in an absolute pressure manner, a gauge pressure manner, or a differential pressure manner. The pressure sensor 140 may transmit the generated pressure sensing signal to the controller 170.

The controller 170 may include a memory (e.g., storage device) for storing data and a processor (e.g., processing circuitry) for signal processing and for generating control signals CS1 to CS3. The controller 170 may generate the first control signal CS1 for controlling the driving of the lower vacuum pump 130 when the lower substrate 10 and the upper substrate 20 are bonded. The controller 170 may transmit the generated first control signal CS1 to the lower vacuum pump 130. The lower vacuum pump 130 may be driven based on the first control signal CS1 received from the controller 170. The air may be suctioned through the plurality of lower vacuum suction holes 132 by the driving of the lower vacuum pump 130 and thus the lower substrate 10 disposed above the lower chuck 110 may be fixed.

The controller 170 may generate the second control signal CS2 for controlling the driving of the upper vacuum pump 150 when the lower substrate 10 and the upper substrate 20 are bonded. The controller 170 may transmit the generated second control signal CS2 to the upper vacuum pump 150. The upper vacuum pump 150 may be driven based on the second control signal CS2 received from the controller 170. The air may be suctioned through the plurality of upper vacuum suction holes 152a and 152b by the driving of the upper vacuum pump 150 and thus the upper substrate 20 disposed below the upper chuck 120 may be fixed.

The controller 170 may generate the third control signal CS3 for controlling the driving of the electric actuator 160 when the lower substrate 10 and the upper substrate 20 are bonded. The controller 170 may transmit the generated third control signal CS3 to the electric actuator 160. The electric actuator 160 may be driven based on the third control signal CS3 received from the controller 170. The bonding pin 162 may be lowered or raised by the driving of the electric actuator 160. Accordingly, the controller 170 may be configured to control the lowering pressure applied by the bonding pin 162, based on controlling the lowering and/or raising (adjusting) of the bonding pin 162.

Control values for adjusting a lowering speed, a lowering pressure, and a lowering distance of the bonding pin 162 are set in the controller 170. The controller 170 may generate the third control signal CS3 for controlling the driving of the electric actuator 160 according to a preset control value. The driving of the electric actuator 160 may be controlled by the third control signal CS3 according to the preset control value.

The controller 170 may receive the pressure sensing signal from the pressure sensor 140. The controller 170 may compare the received pressure sensing signal with the preset control value and determine whether the bonding pin 162 is moved by a preset lowering speed, lowering pressure, and lowering distance. Accordingly, the controller 170 may be configured to adjust the lowering pressure applied by the bonding pin 162 based on the pressure sensing signal that is generated by the pressure sensor 140 based on the sensed lowering pressure applied by the bonding pin 162 through at least the lower substrate 10.

As one example, the controller 170 may compare a sensing pressure value based on the received pressure sensing signal, the sensing pressure value associated with the lowering pressure that is sensed by the pressure sensor 140 and is indicated by the pressure sensing signal, with a preset pressure value and adjust the lowering pressure of the bonding pin 162 on the basis of a comparison result of the two pressure values (e.g., a determination of whether the sensing pressure value is greater or less than the preset pressure value). The preset pressure value may be a particular threshold pressure value. The controller 170 may update the previously set control value on the basis of a comparison result of a sensed pressure value and the preset pressure value. When the sensed pressure value is less than the preset pressure value, the controller 170 may update the control value such that the lowering pressure of the bonding pin 162 is increased. When the sensed pressure value is greater than the preset pressure value, the controller 170 may update the control value such that the lowering pressure of the bonding pin 162 is decreased. The controller 170 may generate the third control signal CS3 on the basis of the updated control value. Accordingly, the controller 170 may adjust the lowering pressure applied by the bonding pin 162 in response to a determination of whether the sensed pressure value is greater or less than the preset pressure value. The controller 170 may transmit the third control signal CS3, which is generated based on the updated control value, to the electric actuator 160. Accordingly, the controller 170 may control the lowering pressure applied by the bonding pin 162 based on the pressure sensing signal generated by the pressure sensor 140, where the pressure sensing signal is generated by the pressure sensor 140 based on the lowering pressure, exerted by the bonding pin 162 on the upper substrate 20 prior to the lower substrate 10 and the upper substrate 20 being bonded together, sensed by the pressure sensor 140.

FIGS. 3, 4, 5, and 6 are views showing a substrate bonding method according to some example embodiments of the inventive concepts.

Figure 3:
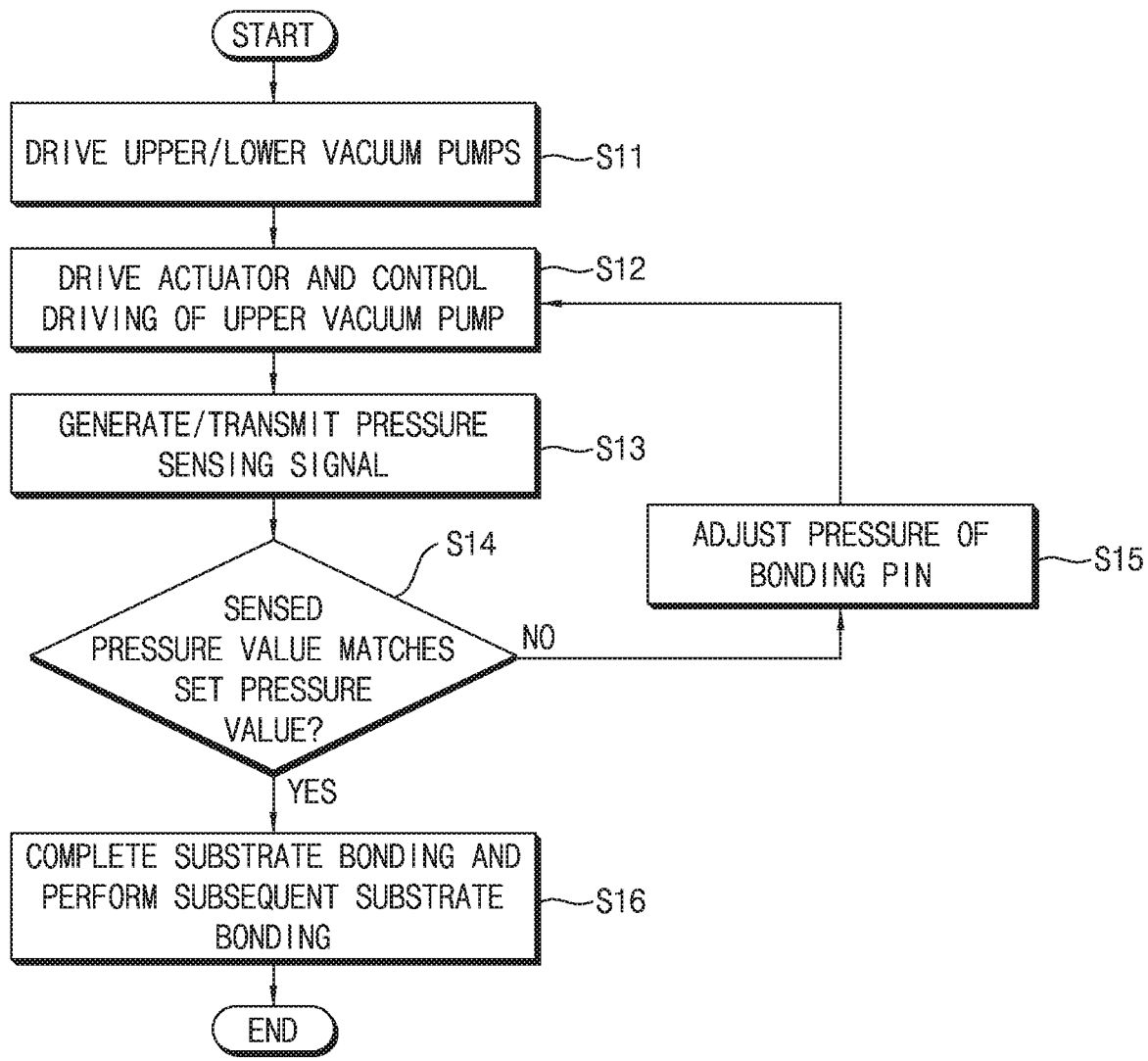
FIGS. 3, 4, 5, and 6 are views showing a substrate bonding method according to some example embodiments of the inventive concepts.
Figure 4:
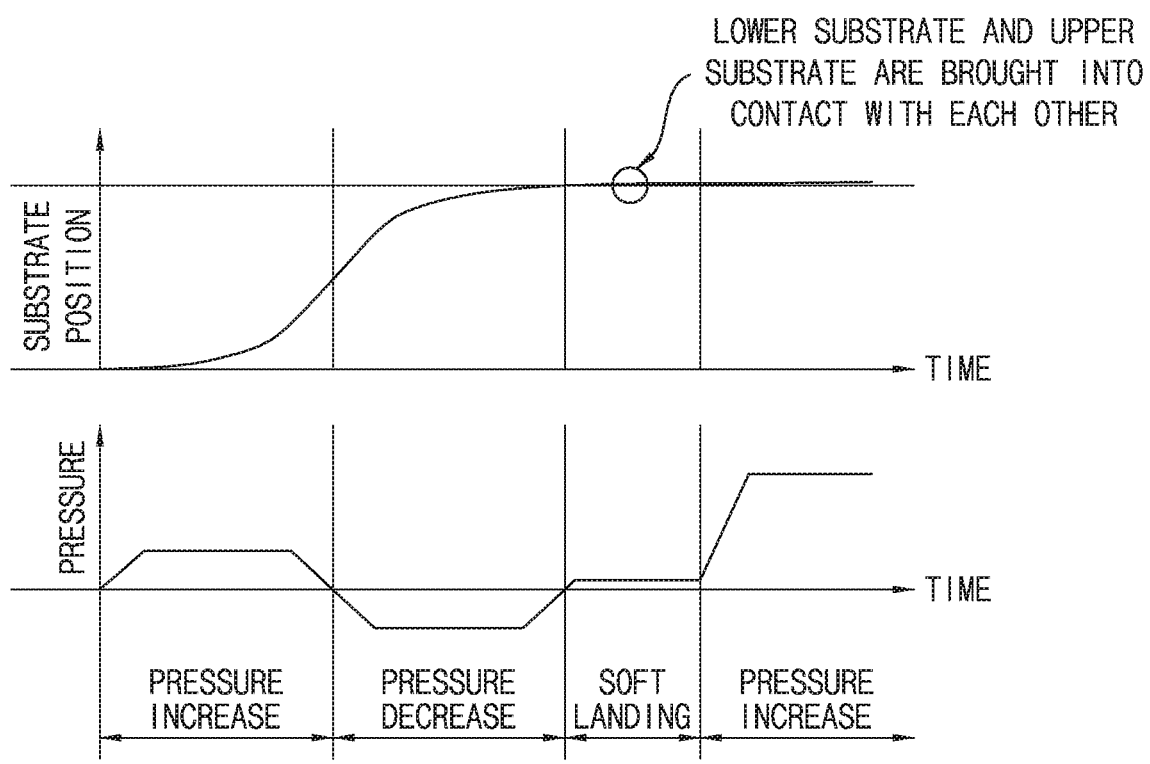

Referring to FIGS. 2 to 4, the lower substrate 10 and the upper substrate 20 may be loaded on the substrate bonding apparatus 100. The lower substrate 10 may be placed on the lower chuck 110 and the upper substrate 20 may be placed on the upper chuck 120. A back surface 10b of the lower substrate 10 may be disposed on the upper surface 110S of the lower chuck 110 and an upper surface 10a of the lower substrate 10 may be disposed to face upward. A back surface 20b of the upper substrate 20 may be disposed on a lower surface 120S of the upper chuck 120 and an upper surface 20a of the upper substrate 20 may be disposed to face downward. The upper surface 10a (a bonded surface) of the lower substrate 10 and the upper surface 20a (a bonded surface) of the upper substrate 20 are subjected to plasma ionization by oxygen gas or nitrogen gas.

Since the plasma ionization may be performed on the bonded surfaces of the lower substrate 10 and the upper substrate 20, the lower substrate 10 and the upper substrate 20 may be bonded by the van der Waals force (intermolecular force).

The controller 170 may drive the lower vacuum pump 130 and the upper vacuum pump 150 (S11).

As one example, the controller 170 may generate a first control signal CS1 for driving the lower vacuum pump 130 and transmit the generated first control signal CS1 to the lower vacuum pump 130. The lower vacuum pump 130 may be driven in response to the first control signal CS1 received from the controller 170. Air may be suctioned through the lower vacuum suction holes 132 by the driving of the lower vacuum pump 130, and the lower substrate 10 may be fixed onto the lower chuck 110. The controller 170 may generate a second control signal CS2 for driving the upper vacuum pump 150 and transmit the generated second control signal CS2 to the upper vacuum pump 150. The upper vacuum pump 150 may be driven in response to the second control signal CS2 received from the controller 170. The air may be suctioned through the upper vacuum suction holes 152a and 152b by the driving of the upper vacuum pump 150 and the upper substrate 20 may be fixed onto a lower surface of the upper chuck 120.

Figure 5:
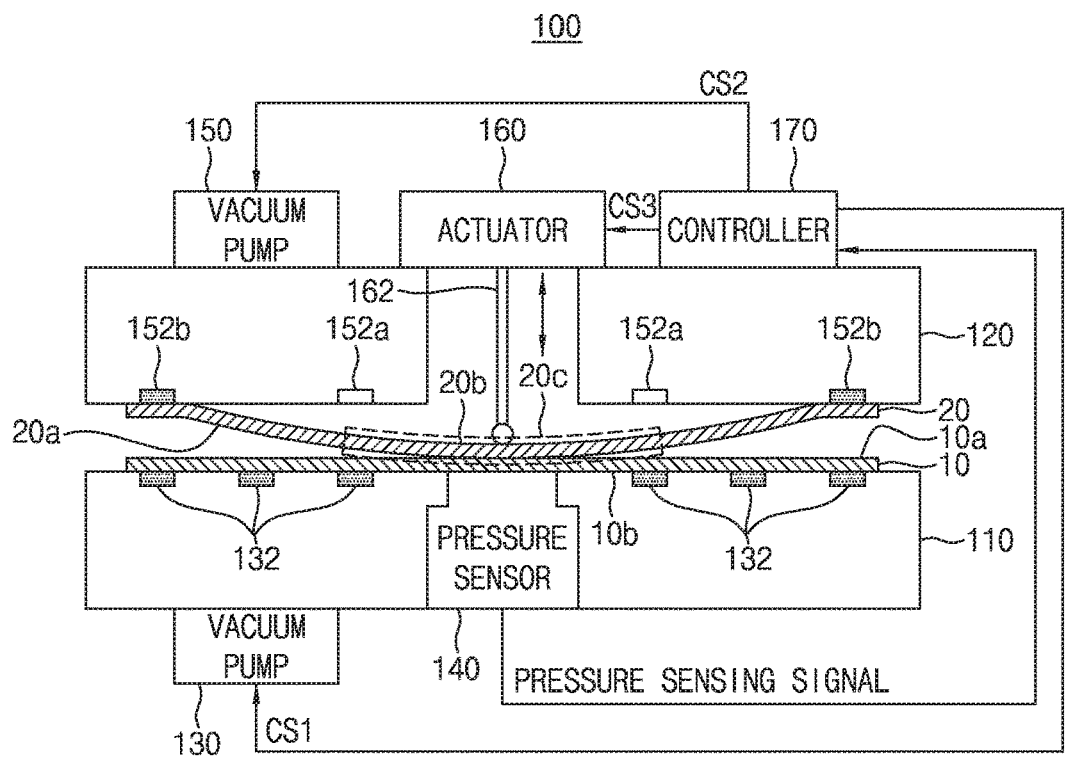

Then, referring to FIGS. 3 to 5, the controller 170 may drive the electric actuator 160 and control the driving of the upper vacuum pump 150 (S12).

As one example, the controller 170 may generate a third control signal CS3 for driving the electric actuator 160 and transmit the generated third control signal CS3 to the electric actuator 160. The electric actuator 160 may be driven in response to the third control signal CS3 received from the controller 170 so that the bonding pin 162 may be lowered. A central portion of the upper substrate 20 is pushed toward the lower substrate 10 by applying a pressure to the central portion of the upper substrate 20 while the bonding pin 162 is lowered. The controller 170 may control valves of the upper vacuum pump 150 such that the central portion of the upper substrate 20 is easily separated from the lower surface of the upper chuck 120. The air suction using the first upper vacuum suction holes 152a and the second upper vacuum suction holes 152b may be individually controlled by turning the plurality of valves on/off. The controller 170 may control the valves such that the air is suctioned through the second upper vacuum suction holes 152b without being suctioned through the first upper vacuum suction holes 152a.

Figure 6:
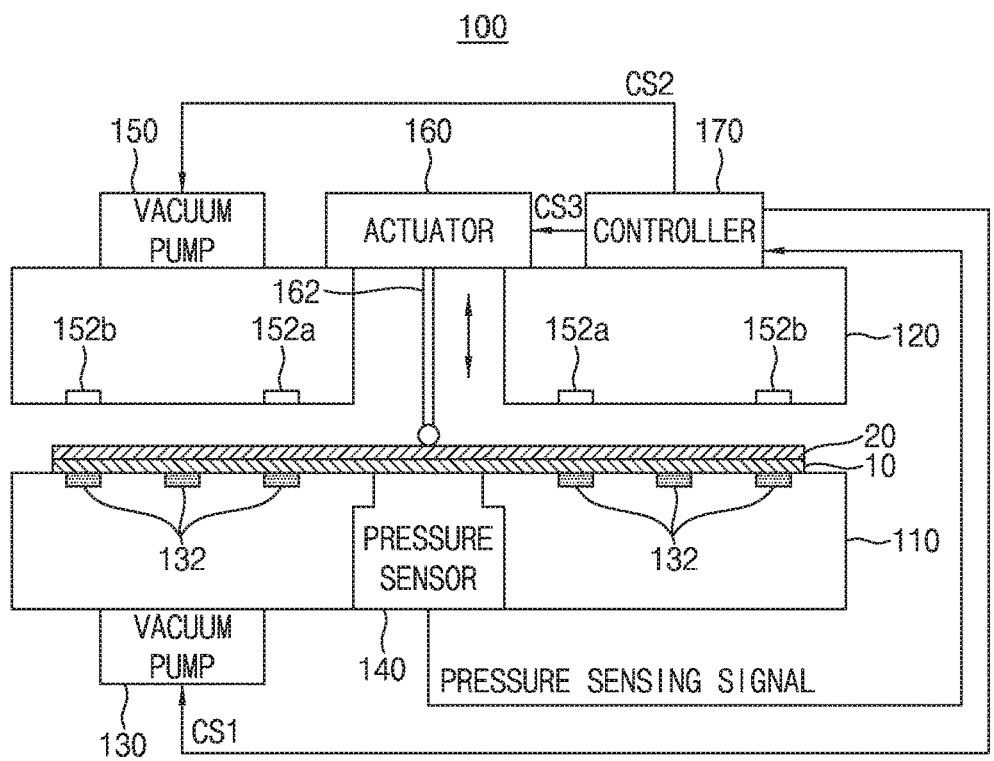

Then, referring to FIGS. 3, 4, and 6, the bonding pin 162 of the electric actuator 160 may apply a set pressure to the central portion of the upper substrate 20 and thus the lower substrate 10 and the upper substrate 20 may be bonded.

The pressure sensor 140 may sense a pressure applied when the lower substrate 10 and the upper substrate 20 are bonded, generate a pressure sensing signal, and transmit the generated pressure sensing signal to the controller 170 (S13). The pressure sensor 140 may sense the pressure applied by the bonding pin 162 to the pressure sensor 140 in real time from a time when the lower substrate 10 and the upper substrate 20 are brought into contact with each other until entire surfaces of the lower substrate 10 and the upper substrate 20 are bonded (e.g., such that pressure applied by the bonding pin 162 is transmitted through the upper substrate 20 and the lower substrate 10 to the pressure sensor 140) and generate the pressure sensing signal.

The controller 170 may control the valves of the upper vacuum pump 150 such that an edge of the upper substrate 20 is easily separated from the lower surface of the upper chuck 120. The controller 170 may control the valves such that air is not suctioned through the second upper vacuum suction holes 152b. The controller 170 may stop the driving of the upper vacuum pump 150 after the entire surface of the upper substrate 20 is separated from the lower surface of the upper chuck 120.

Then, the controller 170 may receive the pressure sensing signal from the pressure sensor 140. The controller 170 may determine whether a preset first pressure value matches a second pressure value according to the pressure sensing signal (S14).

When it is determined in operation S14 that the preset first pressure value does not match the sensed second pressure value, a previously set control value may be updated to adjust the pressure of the bonding pin (S15).

As one example, when the sensed second pressure value is less than the preset first pressure value, the controller 170 may update the control value such that the lowering pressure of the bonding pin 162 is increased. As one example, when the sensed second pressure value is greater than the preset first pressure value, the controller 170 may update the control value such that the lowering pressure of the bonding pin 162 is decreased. The controller 170 may generate a third control signal CS3 on the basis of the updated control value such that a subsequent substrate bonding is performed. The controller 170 may transmit the third control signal CS3, which is generated based on the updated control value, to the electric actuator 160.

When it is determined in operation S14 that the preset first pressure value matches the sensed second pressure value, the substrate bonding may be completed and a subsequent substrate bonding may be performed based on the preset control value (S16).

As shown in FIGS. 4 and 5, the lowering pressure may be increased to a first pressure in order to separate the upper substrate 20 from the upper chuck 120 at an initial time point at which the bonding pin 162 is lowered, and then the first pressure may be maintained for a predetermined time. In this case, the lowering speed of the bonding pin 162 may also be increased. Thereafter, the lowering pressure may be gradually reduced to a second pressure such that the upper substrate 20 softly lands on an upper surface of the lower substrate 10 when the lower substrate 10 and the upper substrate 20 are brought into contact with each other. The pressure and speed of the bonding pin 162 may be precisely controlled by the driving of the electric actuator 160 so that the soft landing is performed when the lower substrate 10 and the upper substrate 20 are brought into contact with each other. After the lower substrate 10 and the upper substrate 20 are brought into contact with each other, the lowering pressure of the bonding pin 162 may be increased to a third pressure to increase a bonding strength between the lower substrate 10 and the upper substrate 20. The third pressure may be greater than the first pressure, and the second pressure may be smaller than the first pressure. Restated, in some example embodiments, the controller 170 may be configured to increase a magnitude ("pressure") of the lowering pressure applied by the bonding pin 162 to a first pressure to cause a central portion 20C of the upper substrate 20 to be separated from the upper chuck 120, the controller 170 may be configured to decrease the magnitude of the lowering pressure applied by the bonding pin 162 to a second pressure that is smaller than the first pressure subsequently to the central portion 20C of the upper substrate 20 being separate from the upper chuck 120 and pushed towards the lower substrate 10 by the bonding pin 162, and the controller 170 may be configured to increase the magnitude of the lowering pressure applied by the bonding pin 162 to a third pressure greater than the first pressure subsequently to the lower substrate 10 and the upper substrate 20 being brought into contact with each other.

As shown in FIGS. 4 and 6, after the soft landing, the pressure applied to the bonding pin 162 may be increased such that the lower substrate 10 and the upper substrate 20 are bonded, and the pressure may be maintained for a predetermined time.

Figure 7:
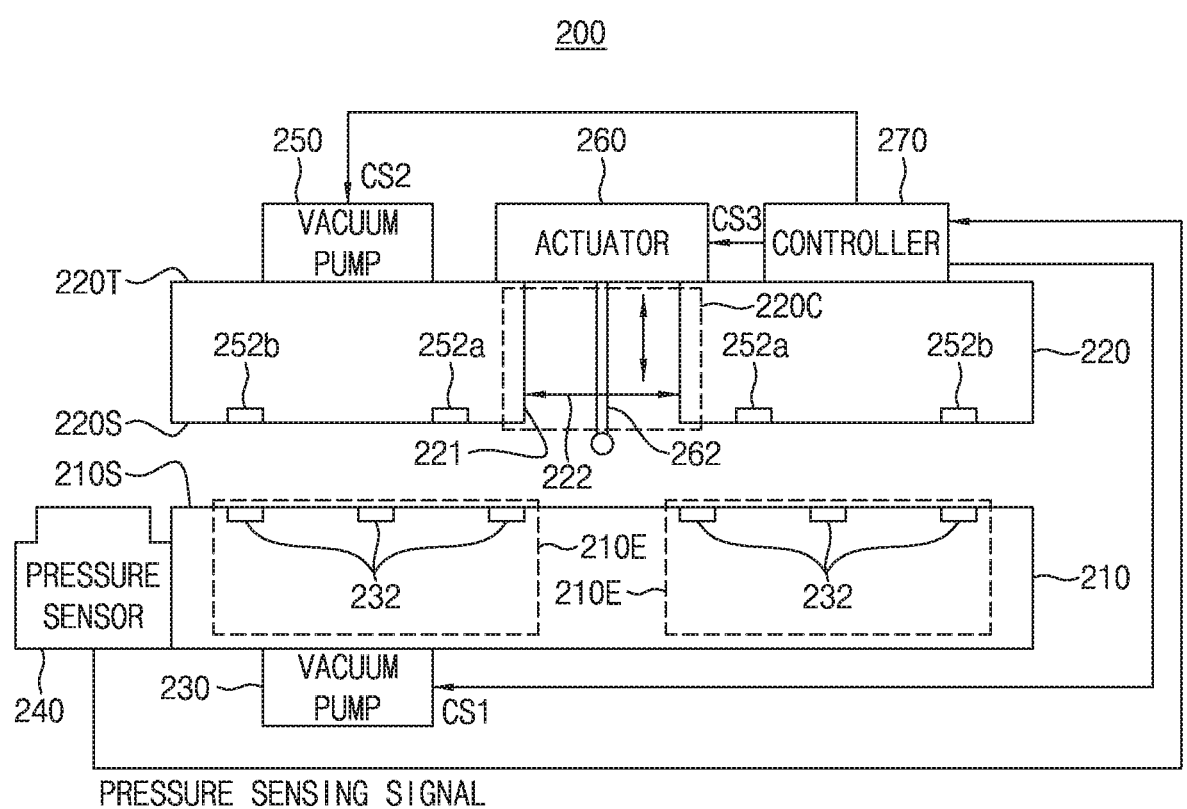
FIG. 7 is a view showing a substrate bonding apparatus according to some example embodiments of the inventive concepts.
Figure 10:
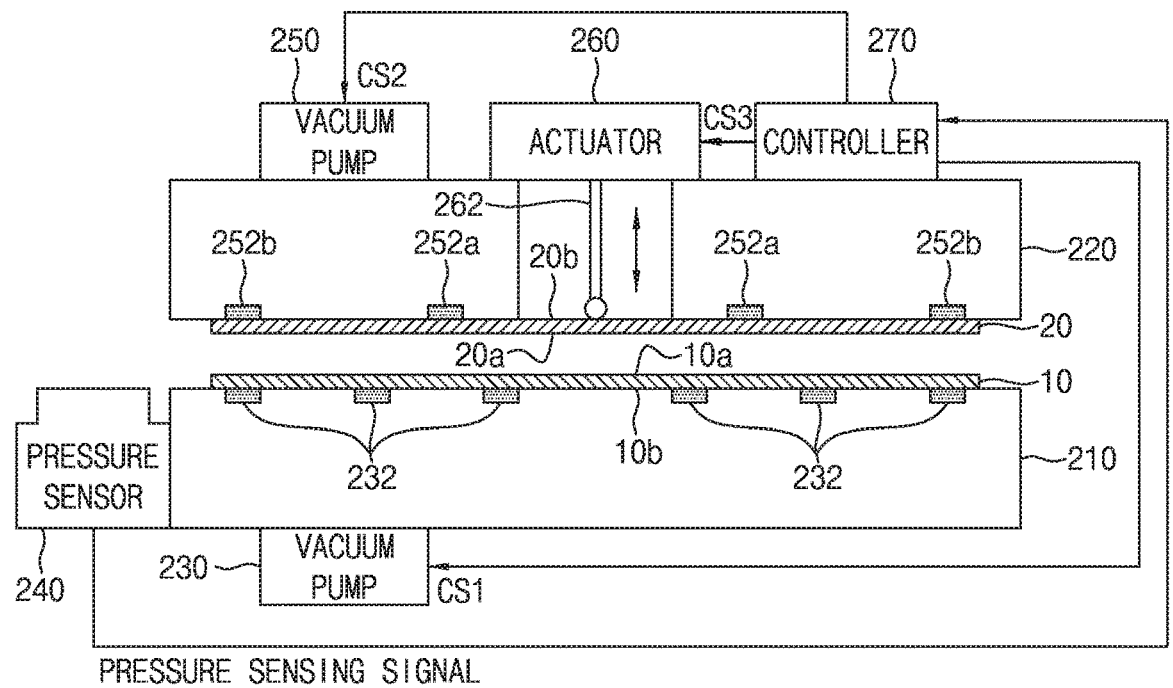

FIG. 7 is a view showing a substrate bonding apparatus according to some example embodiments of the inventive concepts. FIG. 10 is a view showing a substrate bonding apparatus 200 on which a lower substrate 10 and an upper substrate 20 are loaded. In description of the substrate bonding apparatus 200 with reference to FIGS. 7 and 10, a description of the same configuration as that of the substrate bonding apparatus 100 described with reference to FIGS. 1 to 6 may be omitted.

Referring to FIGS. 7 and 10, the substrate bonding apparatus 200 according to some example embodiments of the inventive concepts includes a lower chuck 210, an upper chuck 220, a lower vacuum pump 230, a pressure sensor 240, an upper vacuum pump 250, an electric actuator 260, and a controller 270. Similarly to the lower chuck 110 of FIG. 1, the lower chuck 210 may be configured to support a lower substrate 10 on an upper surface 210S of the lower chuck 210. Similarly to the upper chuck 120 of FIG. 1, the upper chuck 220 may be configured to face the lower chuck 210 such that a lower surface 220S of the upper chuck 220 faces the upper surface 210S of the lower chuck 210 and the upper chuck 220 may be configured to support an upper substrate 20 on the lower surface 220S of the upper chuck 220. Similarly to the electric actuator 160 of FIG. 1, the electric actuator 260 may be on a central portion 220C of the upper chuck 220 (and may be on an upper surface 220T of the upper chuck 220) and may be configured to lower a bonding pin 262 through the upper chuck 220 (e.g., through a conduit 222 defined by one or more inner surfaces 221 of the upper chuck 220 to apply a pressure to the upper substrate 20 supported on the lower surface 220S of the upper chuck 220. Similarly to the controller 170 of FIG. 1, the controller 270 may be configured to control the lowering pressure applied by the bonding pin 262.

A plurality of lower vacuum suction holes 232 may be formed in the lower chuck 210 to fix the lower substrate 10 which is disposed on an upper surface of the lower chuck 210. Each of the plurality of lower vacuum suction holes 232 may be connected to the lower vacuum pump 230 through a connection pipe. When the lower vacuum pump 230 is driven in response to a first control signal CS1 input from the controller 270, air above the lower chuck 210 may be suctioned through the plurality of lower vacuum suction holes 232. Since the air above the lower chuck 210 is suctioned, the lower substrate 10 which is disposed on the upper surface of the lower chuck 210 may be fixed. Restated, the lower chuck 210 may include a plurality of lower vacuum suction holes 232, and the substrate bonding apparatus 200 may include a lower vacuum pump 230 connected to the plurality of lower vacuum suction holes 232 and configured to draw air towards the lower vacuum pump 230 through the lower vacuum suction holes 232 to fix the lower substrate 10 on the upper surface 210S of the lower chuck 210.

A plurality of upper vacuum suction holes 252a and 252b may be formed in the upper chuck 220 to fix the upper substrate 20 which is disposed on a lower surface of the upper chuck 220. The plurality of upper vacuum suction holes 252a and 252b may include first upper vacuum suction holes 252a formed to correspond to a central portion of the upper substrate 20 and second upper vacuum suction holes 252b formed to correspond to an outer portion of the upper substrate 20. Each of the plurality of upper vacuum suction holes 252a and 252b may be connected to the upper vacuum pump 250 through a connection pipe. Restated, the upper chuck 220 may include a plurality of upper vacuum suction holes 252a-252b, and the substrate bonding apparatus 200 may include an upper vacuum pump 250 connected to the plurality of upper vacuum suction holes 252a-252b and configured to draw air towards the upper vacuum pump 250 through the upper vacuum suction holes 252a-252b to fix the upper substrate 20 on the lower surface 220S of the upper chuck 220.

A plurality of valves (e.g., throttle valves) capable of turning on/off suction of air may be disposed between the upper vacuum pump 250 and the plurality of connection pipes. The controller 270 may control the plurality of valves individually while the upper vacuum pump 250 is driven. The air suction using the first upper vacuum suction holes 252a and the second upper vacuum suction holes 252b may be individually controlled by turning the plurality of valves on/off. When the upper vacuum pump 250 is driven in response to a second control signal CS2 input from the controller 270, air below the upper chuck 220 may be suctioned through the plurality of upper vacuum suction holes 252a and 252b. The air below the upper chuck 220 may be suctioned and thus the upper substrate 20 which is disposed on the lower surface of the upper chuck 220 may be fixed.

The electric actuator 260 may be driven in response to a third control signal CS3 input from the controller 270. A bonding pin 262 is connected to the electric actuator 260. The bonding pin 262 may be lowered and raised by the driving of the electric actuator 260. A lowering distance of the bonding pin 262 may be finely adjusted in units of 1 μm to 1 mm by the driving of the electric actuator 260. A pressure, which is applied to the upper substrate 20 by the bonding pin 262, may be finely adjusted in units of 1 mbar by the driving of the electric actuator 260. When the bonding pin 262 is lowered, the pressure may be applied to the upper substrate 20 disposed on the lower surface of the upper chuck 220 so that the upper substrate 20 may be pushed toward the lower substrate 10.

The pressure sensor 240 (also referred to herein as a first pressure sensor) may be disposed on one side of the lower chuck 210. In particular, as shown in FIG. 7, the pressure sensor 240 may be at a side portion 210E of the lower chuck 210. For example, the pressure sensor 240 may be on a sidewall 210W of the lower chuck 210, as shown in FIG. 7. The pressure sensor 240 may sense the pressure applied by the bonding pin 262 to the pressure sensor 240 before the lower substrate 10 and the upper substrate 20 are bonded. Restated, the pressure sensor 240 may be configured to sense a lowering pressure applied by the bonding pin 262 prior to the lower substrate 10 and the upper substrate 20 being bonded together. That is, the bonding pin 262 may be lowered to the pressure sensor 240 (e.g., lowered to directly contact the pressure sensor 240) before ("prior to") the bonding of the lower substrate 10 and the upper substrate 20 together. A pressure applied to the upper substrate 20 by the bonding pin 262 may be sensed in advance by the pressure sensor 240. The pressure sensor 240 may generate a pressure sensing signal (also referred to herein as a first pressure sensing signal) on the basis of the sensed pressure (the lowering pressure sensed by the pressure sensor 240). The pressure sensor 240 may transmit the generated pressure sensing signal to the controller 270.

The controller 270 may generate a first control signal CS1 for controlling the driving of the lower vacuum pump 230 when the lower substrate 10 and the upper substrate 20 are bonded. The controller 270 may transmit the generated first control signal CS1 to the lower vacuum pump 230. The lower vacuum pump 230 may be driven based on the first control signal CS1 received from the controller 270. The air may be suctioned through the plurality of lower vacuum suction holes 232 by the driving of the lower vacuum pump 230 and thus the lower substrate 10 disposed above the lower chuck 210 may be fixed.

The controller 270 may generate a second control signal CS2 for controlling the driving of the upper vacuum pump 250. The controller 270 may transmit the generated second control signal CS2 to the upper vacuum pump 250. The upper vacuum pump 250 may be driven based on the second control signal CS2 received from the controller 270. The air may be suctioned through the plurality of upper vacuum suction holes 252a and 252b by the driving of the upper vacuum pump 250 and thus the upper substrate 20 disposed below the upper chuck 220 may be fixed.

The controller 270 may generate a third control signal CS3 for controlling the driving of the electric actuator 260. The controller 270 may transmit the generated third control signal CS3 to the electric actuator 260. The electric actuator 260 may be driven based on the third control signal CS3 received from the controller 270. The bonding pin 262 may be lowered or raised by the driving of the electric actuator 260. Control values for adjusting a lowering speed, a lowering pressure, and a lowering distance of the bonding pin 262 are set in the controller 270. The controller 270 may generate the third control signal CS3 for controlling the driving of the electric actuator 260 according to a preset control value.

The controller 270 may be configured to adjust the lowering pressure exerted by the bonding pin based on the pressure sensing signal prior to the lower substrate 10 and the upper substrate 20 being bonded together. The controller 270 may receive the pressure sensing signal from the pressure sensor 240. The controller 270 may compare the received pressure sensing signal with the preset control value and determine whether the bonding pin 262 is moved by a preset lowering speed, lowering pressure, and lowering distance. Accordingly, the controller 270 may be configured to compare a first pressure value according to the pressure sensing signal with a preset pressure value, and adjust the lowering pressure applied by the bonding pin in response to a determination of whether the first pressure value is greater or less than the preset pressure value.

As one example, the controller 270 may compare a pressure value based on the sensing signal with a preset pressure value and adjust the lowering pressure of the bonding pin 262 on the basis of a comparison result of the two pressure values. The controller 270 may update the previously set control value on the basis of a comparison result of a sensed pressure value and the preset pressure value. When the sensed pressure value is less than the preset pressure value, the controller 270 may update the control value such that the lowering pressure of the bonding pin 262 is increased. When the sensed pressure value is greater than the preset pressure value, the controller 270 may update the control value such that the lowering pressure of the bonding pin 262 is decreased. The controller 270 may generate the third control signal CS3 on the basis of the updated control value and transmit the generated third control signal CS3 to the electric actuator 260.

FIGS. 8, 9, 10, 11, and 12 are views showing a substrate bonding method according to some example embodiments of the inventive concepts.

Figure 8:
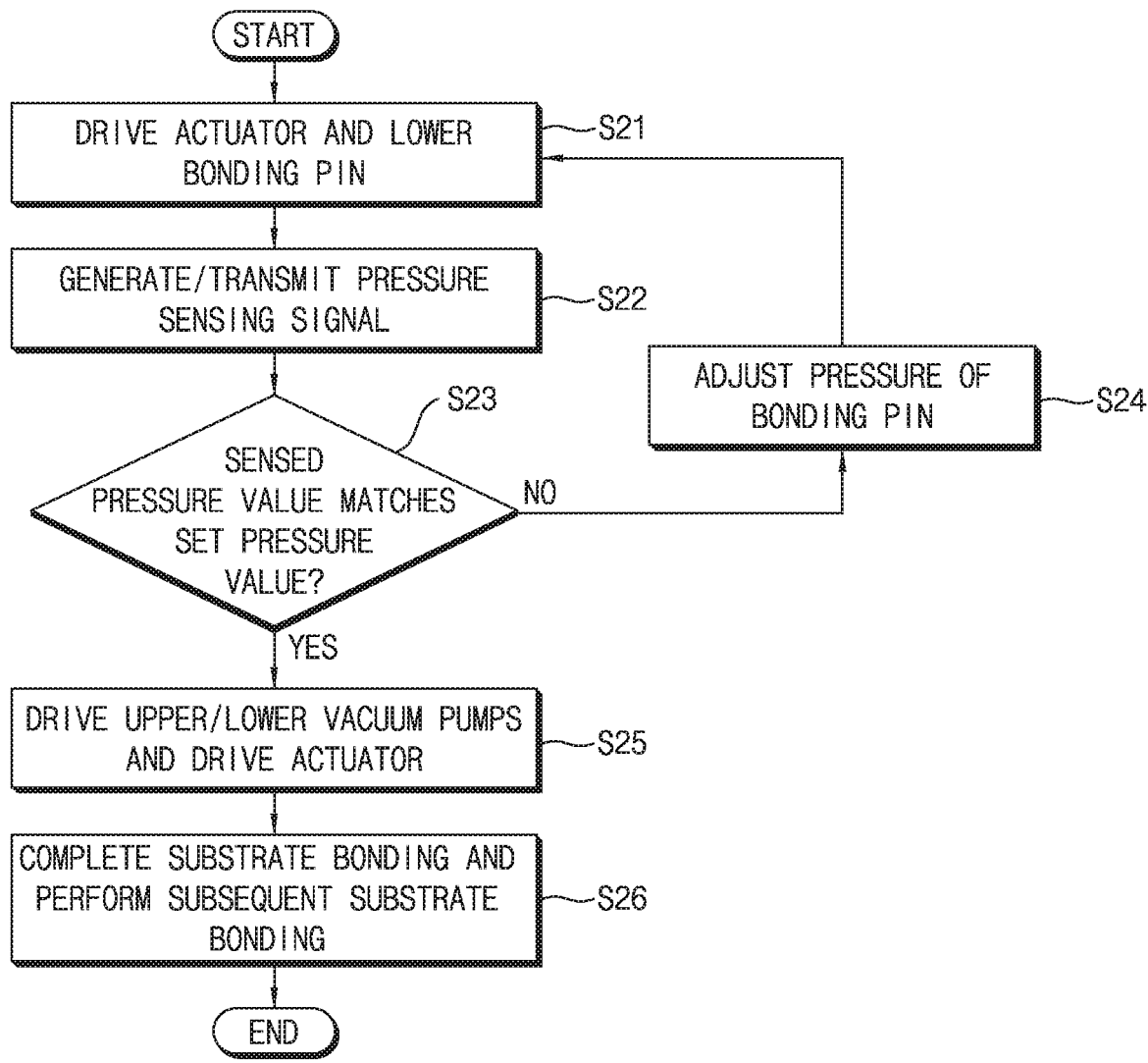
FIGS. 8, 9, 10, 11, and 12 are views showing a substrate bonding method according to some example embodiments of the inventive concepts.
Figure 9:
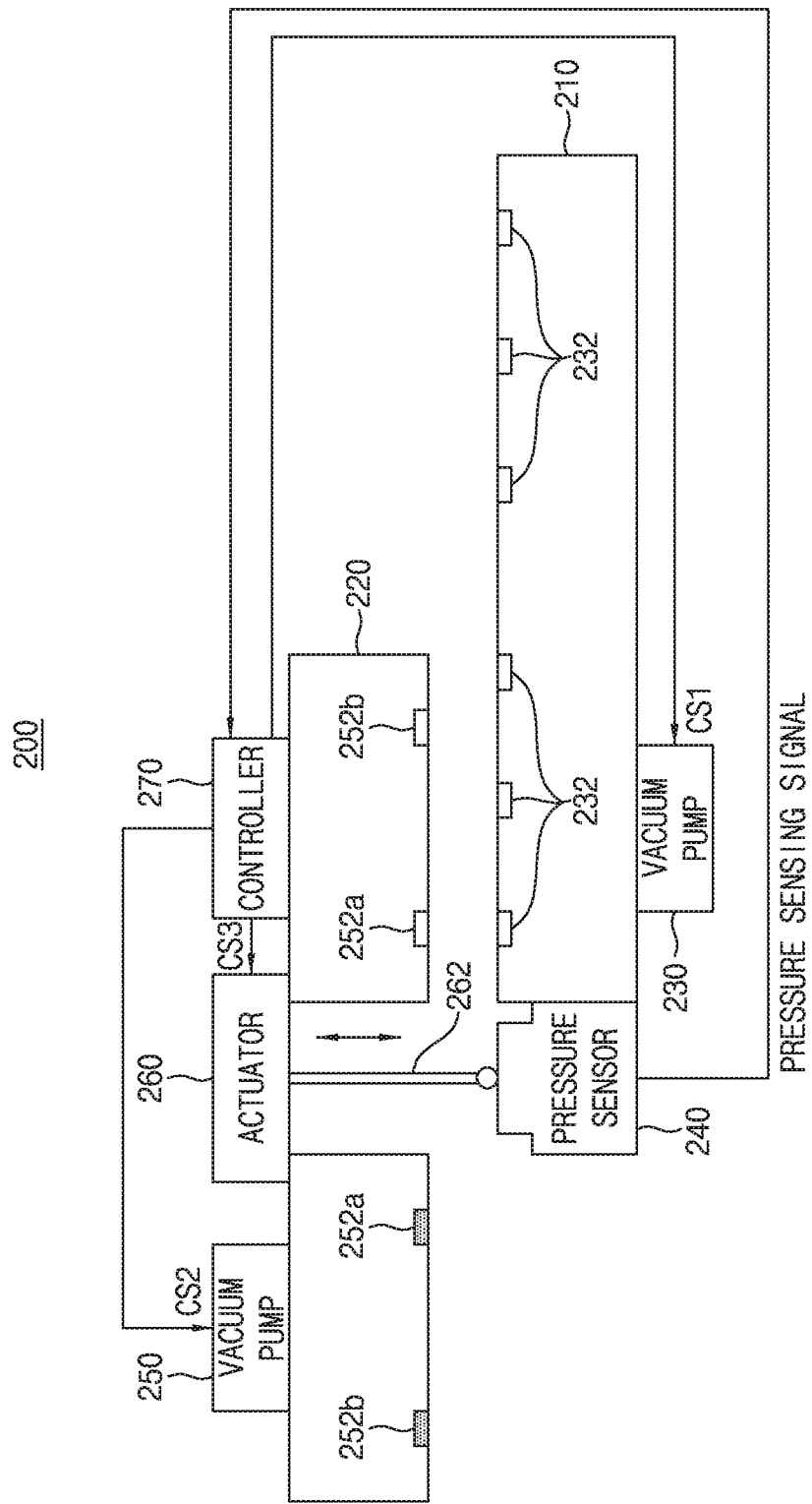

Referring to FIGS. 8 and 9, in order to, in advance, check the pressure applied when the lower substrate 10 and the upper substrate 20 are bonded, the electric actuator 260 may be driven so that the bonding pin 262 may be lowered to the pressure sensor 240 (S21).

As one example, the controller 270 may transmit the third control signal CS3 to the electric actuator 260 and the electric actuator 260 may be driven based on the received third control signal CS3. The bonding pin 262 may be lowered to the pressure sensor 240 by the driving of the electric actuator 260 and the bonding pin 262 may apply a preset pressure to the pressure sensor 240.

Then, the pressure sensor 240 may sense the pressure applied by the bonding pin 262. The pressure sensor 240 may generate a pressure sensing signal and transmit the generated pressure sensing signal to the controller 270 (S22).

Then, the controller 270 may receive the pressure sensing signal from the pressure sensor 240. The controller 270 may determine whether a preset first pressure value matches a second pressure value according to the pressure sensing signal (S23).

When it is determined in operation S23 that the preset first pressure value does not match the sensed second pressure value, a previously set control value may be updated to adjust the pressure of the bonding pin (S24).

As one example, when the sensed second pressure value is less than the preset first pressure value, the controller 270 may update the control value such that the lowering pressure of the bonding pin 262 is increased. As one example, when the sensed second pressure value is greater than the preset first pressure value, the controller 270 may update the control value such that the lowering pressure of the bonding pin 262 is decreased. The controller 270 may generate a third control signal CS3 on the basis of the updated control value such that a subsequent substrate bonding is performed. The controller 270 may transmit the third control signal CS3, which is generated based on the updated control value, to the electric actuator 260.

When it is determined in operation S23 that the preset first pressure value matches the sensed second pressure value, the substrate bonding may be completed and the bonding of the lower substrate 10 and the upper substrate 20 may be performed.

Referring to FIGS. 8 and 10, the lower substrate 10 and the upper substrate 20 may be loaded on the substrate bonding apparatus 200. The lower substrate 10 may be placed on the lower chuck 210 and the upper substrate 20 may be placed on the upper chuck 220. A back surface 10b of the lower substrate 10 may be disposed on the upper surface 210S of the lower chuck 210 and an upper surface 10a of the lower substrate 10 may be disposed to face upward. A back surface 20b of the upper substrate 20 may be disposed on a lower surface 220S of the upper chuck 220 and an upper surface 20a of the upper substrate 20 may be disposed to face downward.

Then, the controller 270 may drive the lower vacuum pump 230, the upper vacuum pump 250, and the electric actuator 260 (S25).

As one example, the controller 270 may generate a first control signal CS1 for driving the lower vacuum pump 230 and transmit the generated first control signal CS1 to the lower vacuum pump 230. The lower vacuum pump 230 may be driven in response to the first control signal CS1 received from the controller 270. Air may be suctioned through the lower vacuum suction holes 232 by the driving of the lower vacuum pump 230, and the lower substrate 10 may be fixed onto the lower chuck 210. The controller 270 may generate a second control signal CS2 for driving the upper vacuum pump 250 and transmit the generated second control signal CS2 to the upper vacuum pump 250. The upper vacuum pump 250 may be driven in response to the second control signal CS2 received from the controller 270. The air may be suctioned through the upper vacuum suction holes 252a and 252b by the driving of the upper vacuum pump 250, and the upper substrate 20 may be fixed onto a lower surface of the upper chuck 220.

Figure 11:
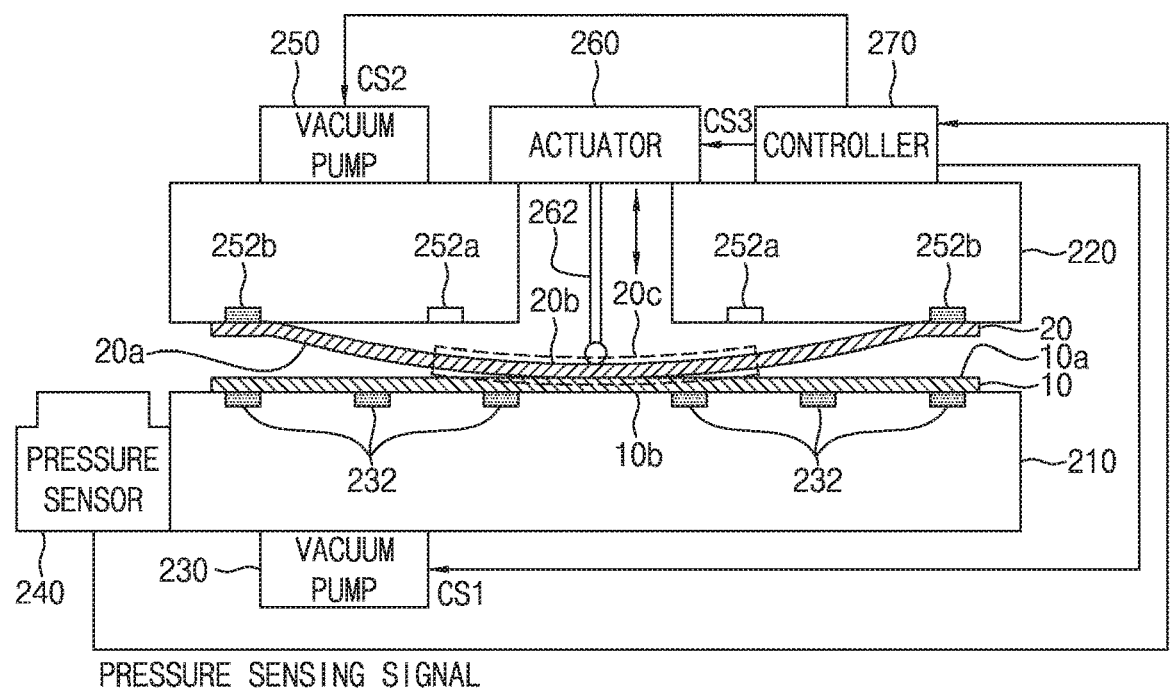

Then, referring to FIGS. 8 and 11, the electric actuator 260 may be driven in response to the third control signal CS3 received from the controller 270 so that the bonding pin 262 may be lowered. A central portion of the upper substrate 20 is pushed toward the lower substrate 10 by applying a pressure to the central portion of the upper substrate 20 while the bonding pin 262 is lowered. The controller 270 may control valves of the upper vacuum pump 250 such that the central portion of the upper substrate 20 is easily separated from the lower surface of the upper chuck 220. The air suction using the first upper vacuum suction holes 252a and the second upper vacuum suction holes 252b may be individually controlled by turning the plurality of valves on/off. The controller 270 may control the valves such that the air is suctioned through the second upper vacuum suction holes 252b without being suctioned through the first upper vacuum suction holes 252a.

Figure 12:
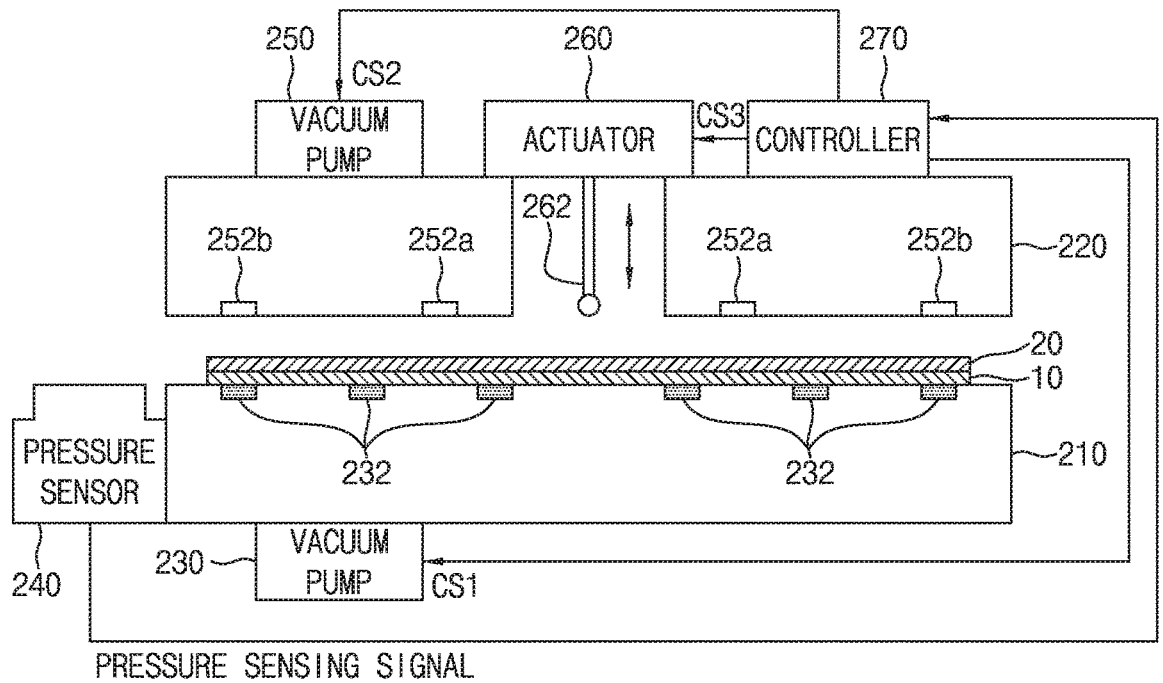

Then, referring to FIGS. 8 and 12, the bonding pin 262 of the electric actuator 260 may apply a set pressure to the central portion of the upper substrate 20 and thus the bonding of the lower substrate 10 and the upper substrate 20 may be completed. After the bonding of the lower substrate 10 and the upper substrate 20, a subsequent substrate bonding may be performed (S26).

The controller 270 may control the valves of the upper vacuum pump 250 such that an edge of the upper substrate 20 is easily separated from the lower surface of the upper chuck 220. The controller 270 may control the valves such that air is not suctioned through the second upper vacuum suction holes 252b. The controller 270 may stop the driving of the upper vacuum pump 250 after the entire surface of the upper substrate 20 is separated from the lower surface of the upper chuck 220.

As shown in FIGS. 4 and 11, the pressure may be increased to a first pressure in order to separate the upper substrate 20 from the upper chuck 220 at an initial time point when the bonding pin 262 is lowered, and then the first pressure may be maintained for a predetermined time. In this case, the lowering speed of the bonding pin 262 may also be increased. Thereafter, the lowering pressure may be gradually reduced to a second pressure such that the upper substrate 20 softly lands on an upper surface of the lower substrate 10 when the lower substrate 10 and the upper substrate 20 are brought into contact with each other. As shown in FIGS. 4 and 12, after the soft landing, the lowering pressure of the bonding pin 262 may be increased to a third pressure such that the lower substrate 10 and the upper substrate 20 are bonded, and the third pressure may be maintained for a predetermined time. The pressure and speed of the bonding pin 262 may be precisely controlled by the driving of the electric actuator 260 so that the soft landing is performed when the lower substrate 10 and the upper substrate 20 are brought into contact with each other. After the lower substrate 10 and the upper substrate 20 are brought into contact with each other, the lowering pressure of the bonding pin 262 may be increased to the third pressure to increase a bonding strength between the lower substrate 10 and the upper substrate 20. The third pressure may be greater than the first pressure, and the second pressure may be smaller than the first pressure. Accordingly, in some example embodiments, the controller 270 may be configured to increase a magnitude of the lowering pressure applied by the bonding pin 262 to a first pressure to cause a portion of the upper substrate 10 to be separated from the upper chuck 220, decrease the magnitude of the lowering pressure applied by the bonding pin 262 to a second pressure smaller than the first pressure subsequently to the central portion of the upper substrate 20 being separated from the upper chuck 220 and pushed towards the lower substrate 10 by the bonding pin 262, and increase the lowering pressure applied by the bonding pin 262 to a third pressure greater than the first pressure subsequently to the lower substrate 10 and the upper substrate 20 being brought into contact with each other.

Figure 13:
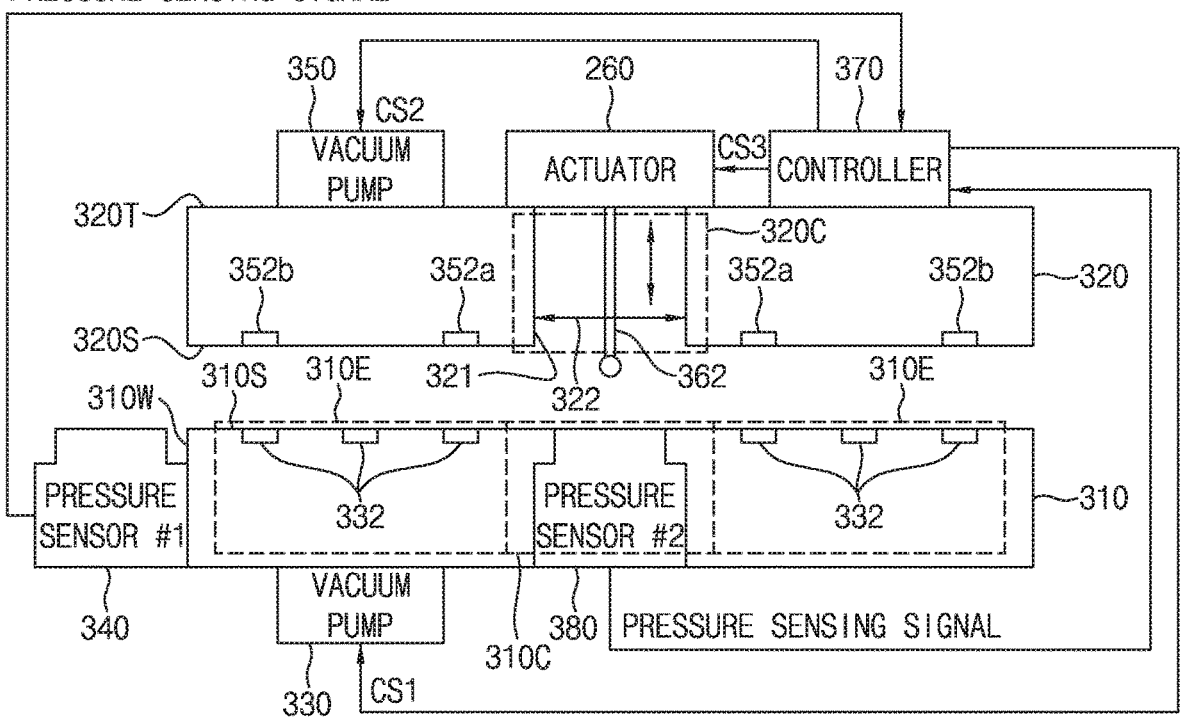
FIG. 13 is a view showing a substrate bonding apparatus according to some example embodiments of the inventive concepts.
Figure 16:
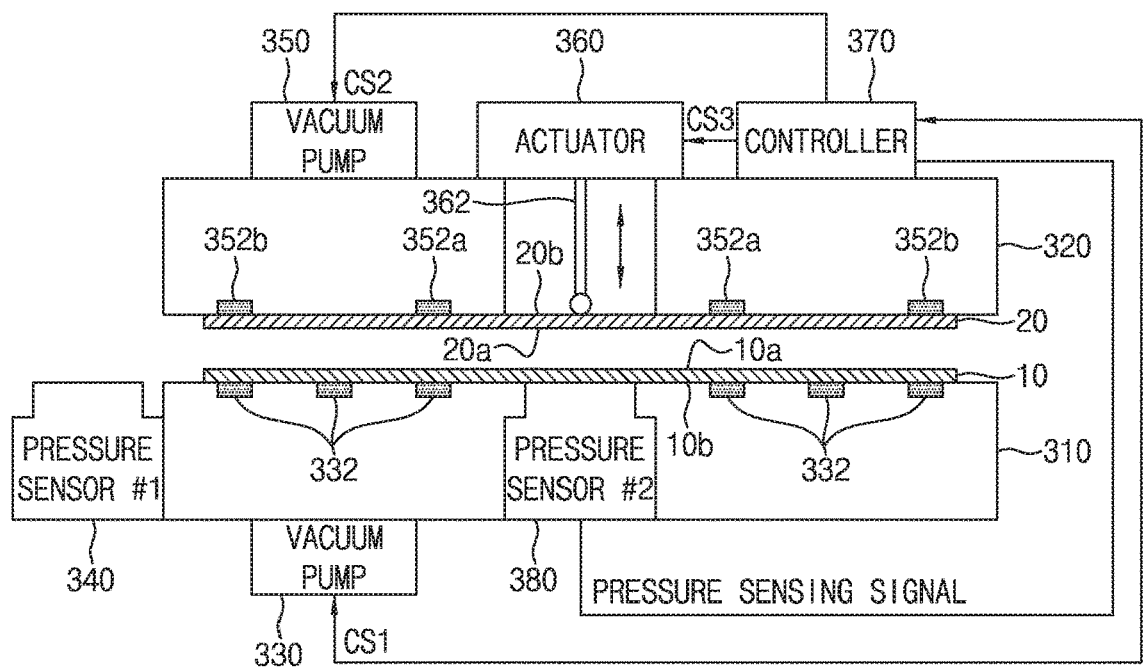

FIG. 13 is a view showing a substrate bonding apparatus according to some example embodiments of the inventive concepts. FIG. 16 is a view showing a substrate bonding apparatus 300 on which a lower substrate 10 and an upper substrate 20 are loaded. In description of the substrate bonding apparatus 300 with reference to FIGS. 13 and 16, a description of the same configuration as that of the substrate bonding apparatus 100 described with reference to FIGS. 1 to 6 and that of the substrate bonding apparatus 200 described with reference to FIGS. 7 to 12 may be omitted. For example, the lower chuck 310 may correspond to the lower chuck 210, the upper chuck 320 may correspond to the upper chuck 320, the electric actuator 360 and bonding pin 362 may correspond to the electric actuator 260 and bonding pin 262, and the first pressure sensor 340 may correspond to the pressure sensor 240. Additionally, the second pressure sensor 380 may correspond to the pressure sensor 140.

Referring to FIGS. 13 and 16, the substrate bonding apparatus 300 according to some example embodiments of the inventive concepts includes a lower chuck 310, an upper chuck 320, a lower vacuum pump 330, a first pressure sensor 340, an upper vacuum pump 350, an electric actuator 360, a controller 370, and a second pressure sensor 380.

As shown in FIGS. 13 and 16, the lower chuck 310 may be configured to support a lower substrate 10 on the upper surface 310S of the lower chuck 310. A plurality of lower vacuum suction holes 332 may be formed in the lower chuck 310 to fix the lower substrate 10 which is disposed on an upper surface of the lower chuck 310. Each of the plurality of lower vacuum suction holes 332 may be connected to the lower vacuum pump 330 through a connection pipe. When the lower vacuum pump 330 is driven in response to a first control signal CS1 input from the controller 370, air above the lower chuck 310 may be suctioned through the plurality of lower vacuum suction holes 332. Since the air above the lower chuck 310 is suctioned, the lower substrate 10 which is disposed on the upper surface of the lower chuck 310 may be fixed. Restated, the lower chuck 310 may include a plurality of lower vacuum suction holes 332, and the substrate bonding apparatus 300 may include a lower vacuum pump 330 connected to the plurality of lower vacuum suction holes 332 and configured to draw air towards the lower vacuum pump 330 through the lower vacuum suction holes 332 to fix the lower substrate 10 on the upper surface 310S of the lower chuck 310.

A plurality of upper vacuum suction holes 352a and 352b may be formed in the upper chuck 320 to fix the upper substrate 20 which is disposed on a lower surface of the upper chuck 320. Restated, the upper chuck 320 may be configured to support an upper substrate 20 on the lower surface 320S of the upper chuck 320. The plurality of upper vacuum suction holes 352a and 352b may include first upper vacuum suction holes 352a formed to correspond to a central portion of the upper substrate 20 and second upper vacuum suction holes 352b formed to correspond to an outer portion of the upper substrate 20. Each of the plurality of upper vacuum suction holes 352a and 352b may be connected to the upper vacuum pump 350 through a connection pipe. Restated, the upper chuck 320 may include a plurality of upper vacuum suction holes 352a-352b, and the substrate bonding apparatus 300 may include an upper vacuum pump 350 connected to the plurality of upper vacuum suction holes 352a-352b and configured to draw air towards the upper vacuum pump 350 through the upper vacuum suction holes 352a-352b to fix the upper substrate 20 on the lower surface 320S of the upper chuck 320.

A plurality of valves (e.g., throttle valves) capable of turning on/off suction of air may be disposed between the upper vacuum pump 350 and a plurality of connection pipes. The controller 370 may control the plurality of valves individually while the upper vacuum pump 350 is driven. The air suction using the first upper vacuum suction holes 352a and the second upper vacuum suction holes 352b may be individually controlled by turning the plurality of valves on/off. When the upper vacuum pump 350 is driven in response to a second control signal CS2 input from the controller 370, air below the upper chuck 320 may be suctioned through the plurality of upper vacuum suction holes 352a and 352b. The air below the upper chuck 320 may be suctioned and thus the upper substrate 20 which is disposed on the lower surface of the upper chuck 320 may be fixed.

As shown in at least FIGS. 13 and 16, the electric actuator 360 may be on an upper surface 320T of the upper chuck 320. As further shown in FIGS. 13 and 16, the electric actuator 360 may be on a central portion 320C of the upper chuck 320. The central portion 320C of the upper chuck 320 may include one or more inner surfaces 321 that define a conduit 322 extending through the upper chuck 320 between the upper surface 320T and the lower surface 320S thereof, and the electric actuator 360 may be on the central portion 320C of the upper chuck 320 such that the electric actuator 360 is aligned with the conduit 322 in the vertical direction (e.g., the direction extending perpendicular to the upper surface 310S of the lower chuck 310). The electric actuator 360 may be driven in response to a third control signal CS3 input from the controller 370. A bonding pin 362 is connected to the electric actuator 360. The bonding pin 362 may be lowered and raised by the driving of the electric actuator 360. As shown in FIGS. 33 and 36, the electric actuator 360 may be configured to lower and/or raise the bonding pin 362 through the conduit 322, such that the electric actuator 360 may lower and/or raise the bonding pin 362 through the upper chuck 320, such that the bonding pin 362 may be lowered through the upper chuck 320 to apply a pressure to the upper substrate 20 supported on the lower surface 320S of the upper chuck 320, based on the bonding pin 362 being lowered into direct contact with the upper substrate 20 by the electric actuator 360. A lowering distance of the bonding pin 362 may be finely adjusted in units of 1 μm to 1 mm by the driving of the electric actuator 360. A pressure applied to the upper substrate 20 by the bonding pin 362 may be finely adjusted in units of 1 mbar by the driving of the electric actuator 360. When the bonding pin 362 is lowered, the pressure may be applied to the upper substrate 20 disposed on the lower surface of the upper chuck 320 so that the upper substrate 20 may be pushed toward the lower substrate 10. Restated, the electric actuator 360 may be configured to lower the bonding pin 362 through the upper chuck 320 to apply pressure to the upper substrate 20 supported on the lower surface 320S of the upper chuck 320.

The first pressure sensor 340 may be disposed on one side of the lower chuck 310. In particular, as shown in FIG. 13, the first pressure sensor 340 may be at a side portion 310E of the lower chuck 310. For example, the first pressure sensor 340 may be on a sidewall 310W of the lower chuck 310, as shown in FIG. 13. The first pressure sensor 340 may sense the pressure applied by the bonding pin 362 before the lower substrate 10 and the upper substrate 20 are bonded. Restated, the first pressure sensor 340 may be configured to sense a lowering pressure applied by the bonding pin 362 to the first pressure sensor 340 prior to the lower substrate 10 and the upper substrate 20 being bonded together. That is, the bonding pin 362 is lowered to the first pressure sensor 340 (e.g., lowered to directly contact the first pressure sensor 340) before the bonding of the lower substrate 10 and the upper substrate 20. The pressure to be applied to the upper substrate 20 by the bonding pin 362 may be sensed in advance by the first pressure sensor 340. The first pressure sensor 340 may generate a first pressure sensing signal on the basis of the sensed pressure. The first pressure sensor 340 may transmit the generated first pressure sensing signal to the controller 370.

The second pressure sensor 380 may be disposed to correspond to a central portion 310C of the lower chuck 310, that is, a central portion of the lower substrate 10, where the central portion 310C of the lower chuck 310 may be aligned with the central portion 320C of the upper chuck 320 in the vertical direction such that the second pressure sensor 380 may be aligned with the conduit 322 and the bonding pin 362 in the vertical direction. The second pressure sensor 380 may be disposed below the lower substrate 10 and may sense a pressure, which is applied by the bonding pin 362 to the second pressure sensor 380 when the lower substrate 10 and the upper substrate 20 are bonded, in real time (e.g., the pressure applied by the bonding pin 362 is transmitted to the second pressure sensor 380 through the upper substrate 20 and the lower substrate 10). The second pressure sensor 380 may convert the sensed pressure into an electrical signal. The second pressure sensor 380 may generate a second pressure sensing signal on the basis of the sensed pressure. Restated, the second pressure sensor 380 may generate a second pressure sensing signal based on the lowering pressure sensed by the second pressure sensor 380. The second pressure sensor 380 may generate the second pressure sensing signal in an absolute pressure manner, a gauge pressure manner, or a differential pressure manner. The second pressure sensor 380 may transmit the generated second pressure sensing signal to the controller 370.

The controller 370 may generate the first control signal CS1 for controlling the driving of the lower vacuum pump 330 when the lower substrate 10 and the upper substrate 20 are bonded. The controller 370 may transmit the generated first control signal CS1 to the lower vacuum pump 330. The lower vacuum pump 330 may be driven based on the first control signal CS1 received from the controller 370. The air may be suctioned through the plurality of lower vacuum suction holes 332 by the driving of the lower vacuum pump 330 and thus the lower substrate 10 disposed above the lower chuck 310 may be fixed.

The controller 370 may generate the second control signal CS2 for controlling the driving of the upper vacuum pump 350. The controller 370 may transmit the generated second control signal CS2 to the upper vacuum pump 350. The upper vacuum pump 350 may be driven based on the second control signal CS2 received from the controller 370. The air may be suctioned through the plurality of upper vacuum suction holes 352a and 352b by the driving of the upper vacuum pump 350 and thus the upper substrate 20 disposed above the upper chuck 320 may be fixed.

The controller 370 may generate the third control signal CS3 for controlling the driving of the electric actuator 360. The controller 370 may transmit the generated third control signal CS3 to the electric actuator 360. The electric actuator 360 may be driven based on the third control signal CS3 received from the controller 370. The bonding pin 362 may be lowered or raised by the driving of the electric actuator 360. Control values for adjusting a lowering speed, a lowering pressure, and a lowering distance of the bonding pin 362 are set in the controller 370. The controller 370 may generate the third control signal CS3 for controlling the driving of the electric actuator 360 according to a preset control value.

The controller 370 may receive the first pressure sensing signal from the first pressure sensor 340. The controller 370 may compare the received first pressure sensing signal with the preset control value and determine whether the bonding pin 362 is moved by a preset lowering speed, lowering pressure, and lowering distance. Accordingly, the controller 370 may be configured to adjust the lowering pressure applied by the bonding pin 362 based on the first pressure sensing signal that is generated by the first pressure sensor 340 based on the lowering pressure, applied by the bonding pin 362, that is sensed by the first pressure sensor 340.

As one example, the controller 370 may compare a pressure value on the basis of the first pressure sensing signal with a preset pressure value and adjust the lowering pressure of the bonding pin 362 on the basis of a comparison result of the two pressure values. The controller 370 may update the previously set control value on the basis of a comparison result of a sensed pressure value and the preset pressure value. When the sensed pressure value is less than the preset pressure value, the controller 370 may update the control value such that the lowering pressure of the bonding pin 362 is increased. When the sensed pressure value is greater than the preset pressure value, the controller 370 may update the control value such that the lowering pressure of the bonding pin 362 is decreased. The update of the control value based on the first pressure sensing signal may be performed before the lower substrate 10 and the upper substrate 20 are bonded. The controller 370 may generate the third control signal CS3 on the basis of the updated control value and transmit the generated third control signal CS3 to the electric actuator 360. Accordingly, the controller 370 may adjust the lowering pressure applied by the bonding pin 362 in response to a determination of whether the sensed first pressure value is greater or less than the preset pressure value.

The controller 370 may receive the second pressure sensing signal from the second pressure sensor 380. The controller 370 may compare the received second pressure sensing signal with the preset control value and determine whether the bonding pin 362 is moved by the lowering speed, the lowering pressure, and the lowering distance. Accordingly, the controller 370 may be configured to adjust the lowering pressure applied by the bonding pin 362 based on the second pressure sensing signal that is generated by the second pressure sensor 380 based on the lowering pressure, applied by the bonding pin 362, that is sensed by the second pressure sensor 380.

As one example, the controller 370 may compare the pressure value according to the second pressure sensing signal with the preset pressure value and adjust the lowering pressure of the bonding pin 362 on the basis of a comparison result of the two pressure values. The controller 370 may update the previously set control value on the basis of a comparison result of the sensed pressure value and the preset pressure value. When the sensed pressure value is less than the preset pressure value, the controller 370 may update the control value such that the lowering pressure of the bonding pin 362 is increased. When the sensed pressure value is greater than the preset pressure value, the controller 370 may update the control value such that the lowering pressure of the bonding pin 362 is decreased. The controller 370 may perform the update of the control value based on the second pressure sensing signal in real time. The controller 370 may generate the third control signal CS3 on the basis of the updated control value. The controller 370 may transmit the third control signal CS3, which is generated based on the updated control value, to the electric actuator 360. Accordingly, the controller 370 may adjust the lowering pressure applied by the bonding pin 362 in response to a determination of whether the second pressure value is greater or less than the preset pressure value.

FIGS. 14, 15, 16, 17, and 18 are views showing a substrate bonding method according to some example embodiments of the inventive concepts.

Figure 14:
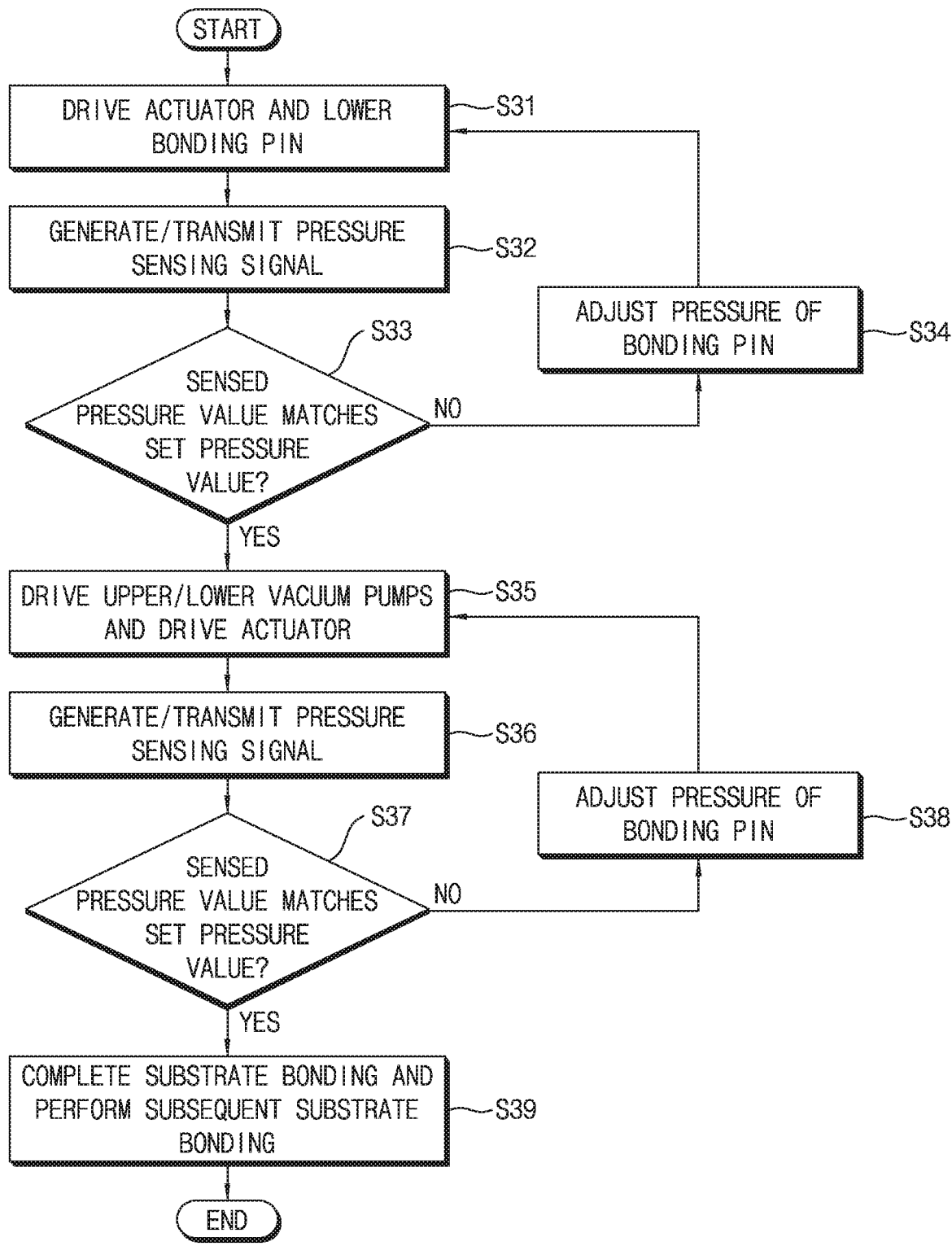
FIGS. 14, 15, 16, 17, and 18 are views showing a substrate bonding method according to some example embodiments of the inventive concepts.
Figure 15:
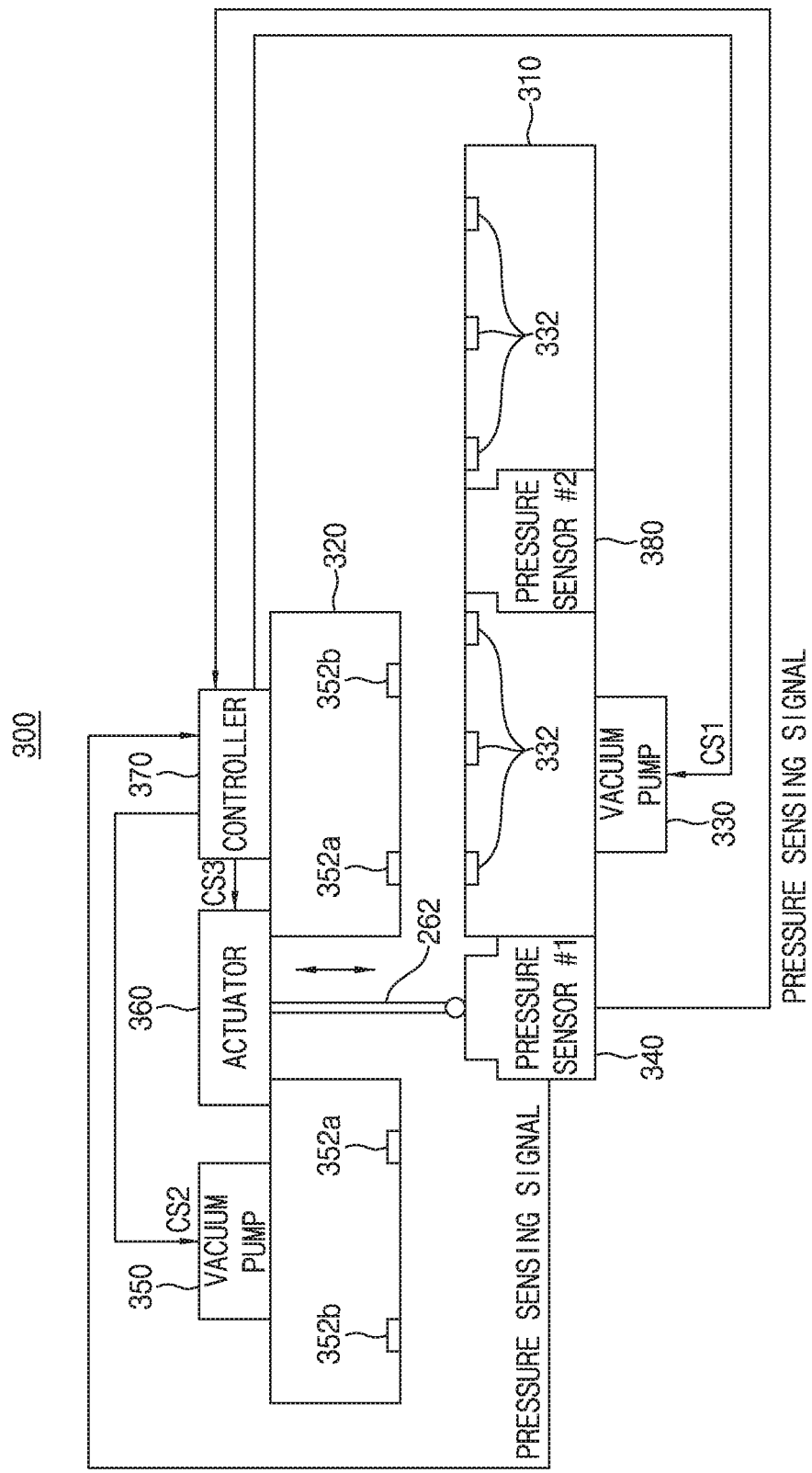

Referring to FIGS. 14 and 15, in order to, in advance, check the pressure applied when the lower substrate 10 and the upper substrate 20 are bonded, the electric actuator 360 may be driven so that the bonding pin 362 may be lowered to the first pressure sensor 340 (S31).

As one example, the controller 370 may transmit the third control signal CS3 to the electric actuator 360 and the electric actuator 360 may be driven based on the received third control signal CS3. The bonding pin 362 may be lowered to the pressure sensor 340 by the driving of the electric actuator 360 and the bonding pin 362 may apply a preset pressure to the pressure sensor 340.

Then, the first pressure sensor 340 may sense the pressure applied by the bonding pin 362. The first pressure sensor 340 may generate a first pressure sensing signal and transmit the generated first pressure sensing signal to the controller 370 (S32).

Then, the controller 370 may receive the first pressure sensing signal from the first pressure sensor 340. The controller 370 may determine whether a preset first pressure value matches a second pressure value according to the first pressure sensing signal (S33).

When it is determined in operation S33 that the preset first pressure value does not match the sensed second pressure value, a previously set control value may be updated to adjust the pressure of the bonding pin (S34).

As one example, when the second pressure value according to the first pressure sensing signal is less than the preset first pressure value, the controller 370 may update the control value such that the lowering pressure of the bonding pin 362 is increased. As one example, when the second pressure value according to the first pressure sensing signal is greater than the preset first pressure value, the controller 370 may update the control value such that the lowering pressure of the bonding pin 362 is decreased. The controller 370 may generate a third control signal CS3 on the basis of the updated control value such that a subsequent substrate bonding is performed. The controller 370 may transmit the third control signal CS3, which is generated based on the updated control value, to the electric actuator 360.

When it is determined in operation S33 that the preset first pressure value matches the sensed second pressure value, the substrate bonding may be completed and the bonding of the lower substrate 10 and the upper substrate 20 may be performed.

Referring to FIGS. 14 and 16, the lower substrate 10 and the upper substrate 20 may be loaded on the substrate bonding apparatus 300. The lower substrate 10 may be placed ("loaded") on the upper surface 310S of the lower chuck 310 and the upper substrate 20 may be placed ("loaded") on the lower surface 320S of the upper chuck 320 that faces the upper surface 310S of the lower chuck 310. A back surface 10b of the lower substrate 10 may be disposed on the upper surface 310S of the lower chuck 310 and an upper surface 10a of the lower substrate 10 may be disposed to face upward. A back surface 20b of the upper substrate 20 may be disposed on a lower surface 320S of the upper chuck 320 and an upper surface 20a of the upper substrate 20 may be disposed to face downward.

Then, the controller 370 may drive the lower vacuum pump 330, the upper vacuum pump 350, and the electric actuator 360 (S35). In operation S35, the controller 370 may drive the electric actuator 360 that is at a central portion 320C of the upper chuck 320 to lower the bonding pin 362 through the upper chuck 320 towards the lower chuck 310.

As one example, the controller 370 may generate a first control signal CS1 for driving the lower vacuum pump 330 and transmit the generated first control signal CS1 to the lower vacuum pump 330. The lower vacuum pump 330 may be driven in response to the first control signal CS1 received from the controller 370. Air may be suctioned through the lower vacuum suction holes 332 by the driving of the lower vacuum pump 330, and the lower substrate 10 may be fixed onto the lower chuck 310. The controller 370 may generate a second control signal CS2 for driving the upper vacuum pump 350 and transmit the generated second control signal CS2 to the upper vacuum pump 350. The upper vacuum pump 350 may be driven in response to the second control signal CS2 received from the controller 370. The air may be suctioned through the upper vacuum suction holes 352a and 352b by the driving of the upper vacuum pump 350 and the upper substrate 20 may be fixed onto a lower surface of the upper chuck 320.

Figure 17:
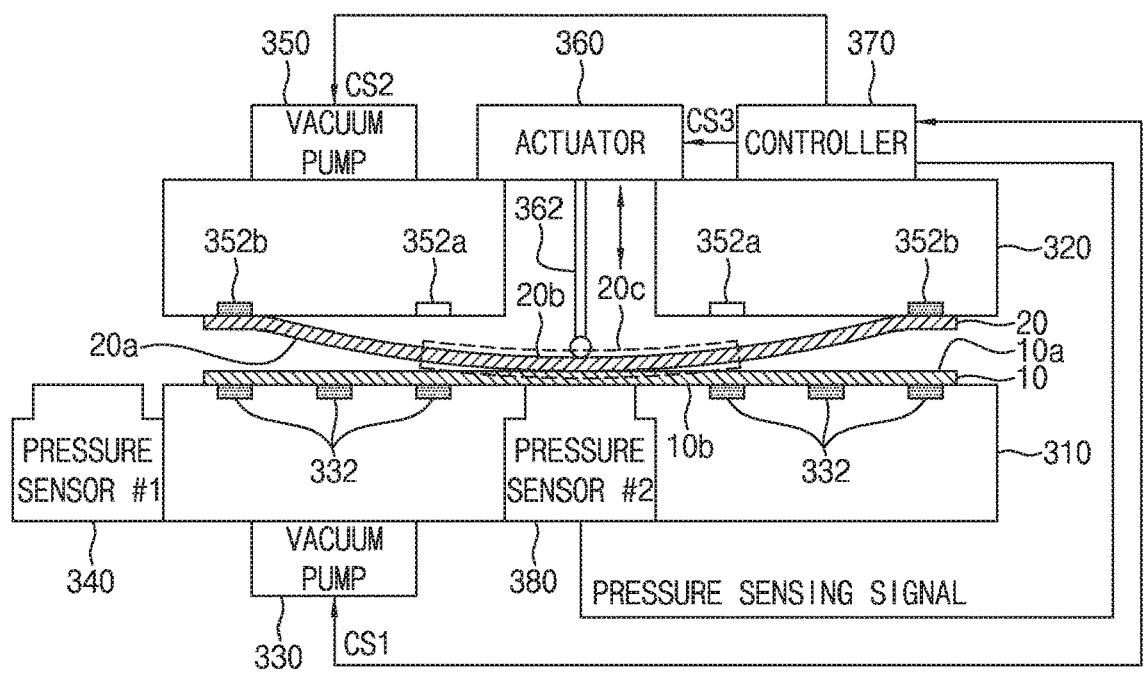

Then, referring to FIGS. 14 and 17, the electric actuator 360 may be driven in response to the third control signal CS3 received from the controller 370 so that the bonding pin 362 may be lowered. A central portion 20C of the upper substrate 20 is pushed toward the lower substrate 10 by applying a pressure to the central portion 20C of the upper substrate 20 while the bonding pin 362 is lowered. The controller 370 may control valves of the upper vacuum pump 350 such that the central portion 20C of the upper substrate 20 is easily separated from the lower surface of the upper chuck 320. Accordingly, the controller 370 may cause the central portion 20C of the upper substrate 20 to be separated from the upper chuck 320 based on a pressure applied by the bonding pin 362 to the upper substrate 20. The air suction using the first upper vacuum suction holes 352a and the second upper vacuum suction holes 352b may be individually controlled by turning the plurality of valves on/off. The controller 370 may control the valve such that the air is suctioned through the second upper vacuum suction holes 352b without being suctioned through the first upper vacuum suction holes 352a.

Still referring to FIG. 17, the upper substrate 20 may be enabled to come into contact with the lower substrate 10, based at least in part upon the pressure applied by the bonding pin 362 to the upper substrate 20.

Figure 18:
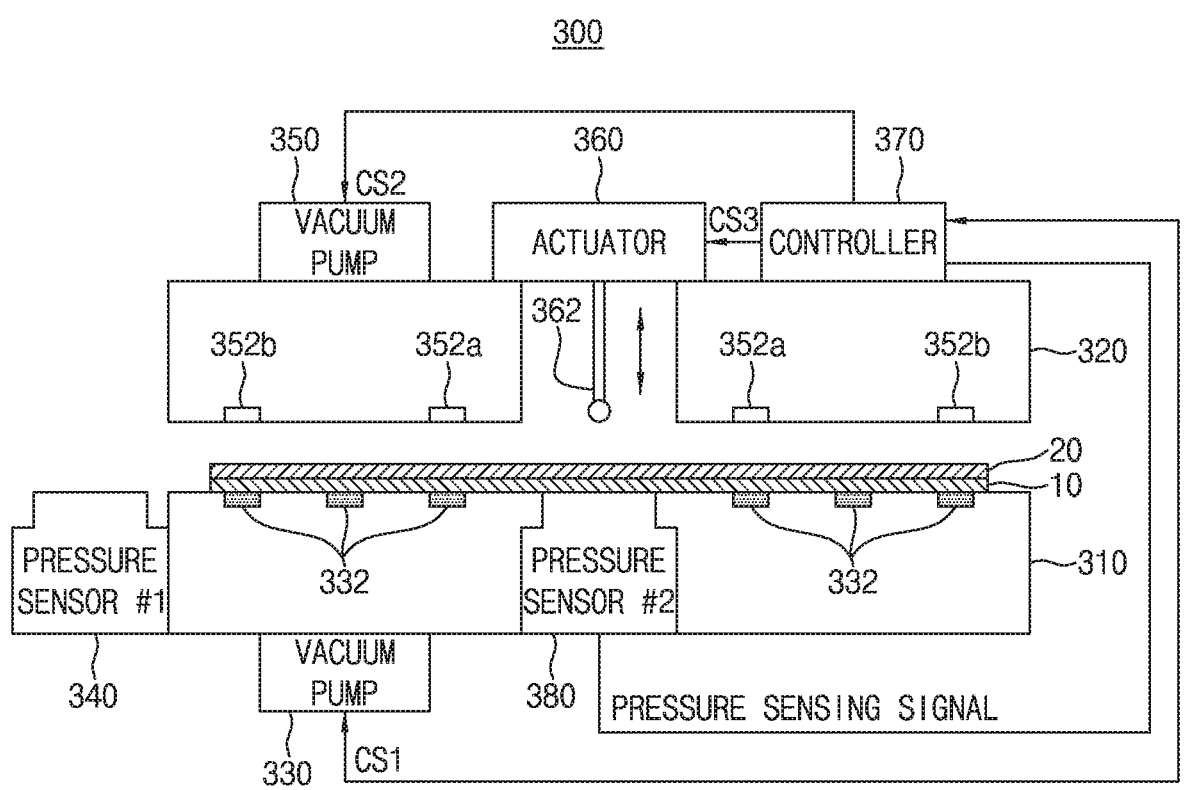

Then, referring to FIGS. 14 and 18, the bonding pin 362 of the electric actuator 360 may apply a set (e.g., "constant") pressure to the central portion of the upper substrate 20 and thus the lower substrate 10 and the upper substrate 20 may be bonded. Accordingly, the controller 370 may cause the bonding pin 362 to apply a constant pressure to bond the upper substrate 20 to the lower substrate 10. The second pressure sensor 380, which is at a central portion 310C of the lower chuck 310 such that the second pressure sensor 380 is below the upper surface 310S of the lower chuck 310 and is configured to be below the lower substrate 10 supported on the upper surface 310S of the lower chuck 310, may sense the pressure applied by the bonding pin 362 to at least the upper substrate 20 when the lower substrate 10 and the upper substrate 20 are bonded, generate a pressure sensing signal (also referred to herein as a first pressure sensing signal and/or a second pressure sensing signal) based on the sensing, and transmit the generated pressure sensing signal to the controller 370 (S36), such that the controller 370 may receive the pressure sensing signal.

The second pressure sensor 380 may sense the pressure in real time until entire surfaces of the lower substrate 10 and the upper substrate 20 are bonded from a time when the lower substrate 10 and the upper substrate 20 are brought into contact with each other, and generate the second pressure sensing signal. (e.g., such that pressure applied by the bonding pin 362 is transmitted through the upper substrate 20 and the lower substrate 10 to the second pressure sensor 380).

The controller 370 may control the valves of the upper vacuum pump 350 such that an edge of the upper substrate 20 is easily separated from the lower surface of the upper chuck 320. The controller 370 may control the valves such that air is not suctioned through the second upper vacuum suction holes 352b. The controller 370 may stop the driving of the upper vacuum pump 350 after the entire surface of the upper substrate 20 is separated from the lower surface of the upper chuck 320.

Then, the controller 370 may receive the second pressure sensing signal from the second pressure sensor 380. The controller 370 may determine whether a preset first pressure value matches a third pressure value according to the second pressure sensing signal (S37).

When it is determined in operation S37 that the preset first pressure value does not match the sensed third pressure value, a previously set control value may be updated to adjust the pressure of the bonding pin (e.g., the lowering pressure applied by the bonding pin 362) (S38).

As one example, when the sensed third pressure value is less than the preset first pressure value, the controller 370 may update the control value such that the lowering pressure of the bonding pin 362 is increased. Accordingly, in some example embodiments, the adjusting at S38 may include comparing a preset pressure value with a sensing pressure value that is based on the pressure sensing signal received at the controller 370 from the second pressure sensor 380 in response to the lowering pressure applied by the bonding pin 362 being adjusted, and increasing the lowering pressure applied by the bonding pin 362 in response to a determination that the sensing pressure value is less than the preset pressure value. As one example, when the sensed third pressure value is greater than the preset first pressure value, the controller 370 may update the control value such that the lowering pressure of the bonding pin 362 is decreased. Accordingly, in some example embodiments, the adjusting at S38 may include comparing a preset pressure value with a sensing pressure value that is based on the pressure sensing signal received at the controller 370 from the second pressure sensor 380 in response to the lowering pressure applied by the bonding pin 362 being adjusted, and decreasing the lowering pressure applied by the bonding pin 362 in response to a determination that the sensing pressure value is greater than the preset pressure value. The controller 370 may generate a third control signal CS3 on the basis of the updated control value such that a subsequent substrate bonding is performed. The controller 370 may transmit the third control signal CS3, which is generated based on the updated control value, to the electric actuator 360.

When it is determined in operation S37 that the preset first pressure value matches the sensed third pressure value, the substrate bonding may be completed and a subsequent substrate bonding may be performed based on the preset control value (S39). Accordingly, the controller 370 may adjust the lowering pressure applied by the bonding pin 362 based on the pressure sensing signal received from the second pressure sensor 380 when subsequent substrates are bonded together.

As shown in FIGS. 4 and 17, the pressure may be increased to a first pressure in order to separate the upper substrate 20 from the upper chuck 320 at an initial time point at which the bonding pin 362 is lowered, and then the first pressure may be maintained for a predetermined time. In this case, the lowering speed of the bonding pin 362 may also be increased. Thereafter, the lowering pressure may be gradually reduced to a second pressure such that the upper substrate 20 softly lands on an upper surface of the lower substrate 10 when the lower substrate 10 and the upper substrate 20 are brought into contact with each other. As shown in FIGS. 4 and 18, after the soft landing, the lowering pressure of the bonding pin 362 may be increased to a third pressure such that the lower substrate 10 and the upper substrate 20 are bonded, and the third pressure may be maintained for a predetermined time. The pressure and speed of the bonding pin 362 may be precisely controlled by the driving of the electric actuator 360 so that the soft landing is performed when the lower substrate 10 and the upper substrate 20 are brought into contact with each other. After the lower substrate 10 and the upper substrate 20 are brought into contact with each other, the lowering pressure of the bonding pin 362 may be increased to the third pressure to increase a bonding strength between the lower substrate 10 and the upper substrate 20. The third pressure may be greater than the first pressure, and the second pressure may be smaller than the first pressure. Accordingly, in some example embodiments, the controller 370 may be configured to increase a magnitude of the lowering pressure applied by the bonding pin 362 to a first pressure to cause a portion of the upper substrate 20 to be separated from the upper chuck 320, decrease the magnitude of the lowering pressure applied by the bonding pin 362 to a second pressure smaller than the first pressure subsequently to the central portion of the upper substrate 20 being separated from the upper chuck 320 and pushed towards the lower substrate 10 by the bonding pin 362, and increase the lowering pressure applied by the bonding pin 362 to a third pressure greater than the first pressure subsequently to the lower substrate 10 and the upper substrate 20 being brought into contact with each other.

A back light-receiving image sensor may be manufactured by the substrate bonding apparatus and method of the inventive concepts. A dynamic random access memory (DRAM) may be manufactured by the substrate bonding apparatus and method of the inventive concepts. Accordingly, it will be understood that each of the substrate bonding apparatuses described herein, including the substrate bonding apparatus 100 and the substrate bonding apparatus 200, may be configured to bond the lower substrate 10 and an upper substrate 20 together to manufacture an image sensor or a dynamic random access memory (DRAM).

According to the example embodiments of the inventive concepts, in the substrate bonding apparatuses and the substrate bonding methods according to the example embodiments of the inventive concepts, the lowering pressure, speed, and distance of the bonding pin can be precisely controlled.

According to the example embodiments of the inventive concepts, in the substrate bonding apparatuses and the substrate bonding methods according to the example embodiments of the inventive concepts, reproducibility of substrate bonding can be ensured.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A substrate bonding apparatus, comprising:
a lower chuck, the lower chuck configured to support a lower substrate on an upper surface of the lower chuck;
an upper chuck, the upper chuck configured to face the lower chuck such that a lower surface of the upper chuck faces the upper surface of the lower chuck, the upper chuck configured to support an upper substrate on the lower surface of the upper chuck;
an electric actuator on a central portion of the upper chuck, the electric actuator configured to lower a bonding pin through the upper chuck to apply a pressure to the upper substrate supported on the lower surface of the upper chuck;
a first pressure sensor at a side portion of the lower chuck such that the first pressure sensor is on a sidewall of the lower chuck, the first pressure sensor configured to sense a lowering pressure applied by the bonding pin to the first pressure sensor based on the bonding pin being lowered to directly contact the first pressure sensor prior to the lower substrate and the upper substrate being loaded on the substrate bonding apparatus and bonded together; and
a controller configured to control the lowering pressure applied by the bonding pin.

2. The substrate bonding apparatus of claim 1, wherein
the first pressure sensor is configured to generate a first pressure sensing signal based on the lowering pressure sensed by the first pressure sensor; and
the controller is configured to adjust the lowering pressure exerted by the bonding pin based on the first pressure sensing signal prior to the lower substrate and the upper substrate being bonded together.

3. The substrate bonding apparatus of claim 2, wherein the controller is configured to
compare a first pressure value according to the first pressure sensing signal with a preset pressure value, and
adjust the lowering pressure applied by the bonding pin in response to a determination of whether the first pressure value is greater or less than the preset pressure value.

4. The substrate bonding apparatus of claim 1, further comprising:
a second pressure sensor at a central portion of the lower chuck such that the second pressure sensor is below the upper surface of the lower chuck and is configured to be below the lower substrate supported on the upper surface of the lower chuck, the second pressure sensor configured to sense a lowering pressure applied by the bonding pin to the second pressure sensor in real time.

5. The substrate bonding apparatus of claim 4, wherein
the second pressure sensor is configured to generate a second pressure sensing signal based on the lowering pressure sensed by the second pressure sensor, and
the controller is configured to adjust the lowering pressure applied by the bonding pin based on the second pressure sensing signal.

6. The substrate bonding apparatus of claim 5, wherein the controller is configured to
compare a second pressure value according to the second pressure sensing signal with a preset pressure value,
adjust the lowering pressure applied by the bonding pin in response to a determination of whether the second pressure value is greater or less than the preset pressure value.

7. The substrate bonding apparatus of claim 1, wherein the controller is configured to
increase a magnitude of the lowering pressure applied by the bonding pin to the upper substrate to a first pressure to cause a central portion of the upper substrate to be separated from the upper chuck;
decrease the magnitude of the lowering pressure applied by the bonding pin to the upper substrate to a second pressure smaller than the first pressure subsequently to the central portion of the upper substrate being separated from the upper chuck and pushed towards the lower substrate by the bonding pin; and
increase the lowering pressure applied by the bonding pin to the upper substrate to a third pressure greater than the first pressure subsequently to the lower substrate and the upper substrate being brought into contact with each other.

8. The substrate bonding apparatus of claim 1, wherein
the lower chuck includes a plurality of lower vacuum suction holes; and
the substrate bonding apparatus further includes a lower vacuum pump connected to the plurality of lower vacuum suction holes and configured to draw air towards the lower vacuum pump through the plurality of lower vacuum suction holes to fix the lower substrate on the upper surface of the lower chuck.

9. The substrate bonding apparatus of claim 1, wherein
the upper chuck includes a plurality of upper vacuum suction holes; and
the substrate bonding apparatus further includes an upper vacuum pump connected to the plurality of upper vacuum suction holes and configured to draw air towards the upper vacuum pump through the plurality of upper vacuum suction holes to fix the upper substrate on the lower surface of the upper chuck.

10. The substrate bonding apparatus of claim 1, wherein the substrate bonding apparatus is configured to bond the lower substrate and the upper substrate together to manufacture an image sensor or a dynamic random access memory (DRAM).

11. A substrate bonding apparatus, comprising:
a lower chuck, the lower chuck configured to support a lower substrate on an upper surface of the lower chuck;
an upper chuck, the upper chuck configured to face the lower chuck such that a lower surface of the upper chuck faces the upper surface of the lower chuck, the upper chuck configured to support an upper substrate on the lower surface of the upper chuck;
an electric actuator on a central portion of the upper chuck, the electric actuator configured to lower a bonding pin through the upper chuck to apply a pressure to the upper substrate supported on the lower surface of the upper chuck;
a pressure sensor at a central portion of the lower chuck such that the pressure sensor is below the upper surface of the lower chuck and is configured to be below the lower substrate supported on the upper surface of the lower chuck, the pressure sensor configured to sense a lowering pressure applied by the bonding pin to the pressure sensor in real time; and
a controller configured to control the lowering pressure applied by the bonding pin to the upper substrate, the controller further configured to
increase a magnitude of the lowering pressure applied by the bonding pin to the upper substrate to a first pressure to cause a central portion of the upper substrate to be separated from the upper chuck, decrease the magnitude of the lowering pressure applied by the bonding pin to the upper substrate to a second pressure smaller than the first pressure subsequently to the central portion of the upper substrate being separated from the upper chuck and pushed towards the lower substrate by the boding pin, and increase the magnitude of the lowering pressure applied by the bonding pin to the upper substrate to a third pressure greater than the first pressure subsequently to the lower substrate and the upper substrate being brought into contact with each other.

12. The substrate bonding apparatus of claim 11, wherein the pressure sensor is configured to generate a pressure sensing signal based on the sensed lowering pressure, and the controller is configured to adjust the lowering pressure applied by the bonding pin to the riper substrate based on the pressure sensing signal.

13. The substrate bonding apparatus of claim 12, wherein the controller is configured to compare a sensing pressure value based on the pressure sensing signal with a preset pressure value, and adjust the lowering pressure exerted by the bonding pin to the upper substrate in response to a determination of whether the sensing pressure value is greater or less than the preset pressure value.

14. The substrate bonding apparatus of claim 11, wherein the lower chuck includes a plurality of lower vacuum suction holes, and the substrate bonding apparatus further includes a lower vacuum pump connected to the plurality of lower vacuum suction holes and configured to draw air towards the lower vacuum pump through the plurality of lower vacuum suction holes to fix the lower substrate on the upper surface of the lower chuck.

15. The substrate bonding apparatus of claim 11, wherein:

the upper chuck includes a plurality of upper vacuum suction holes, and the substrate bonding apparatus further includes an upper vacuum pump connected to the plurality of upper vacuum suction holes and configured to draw air towards the upper vacuum pump through the plurality of upper vacuum suction holes to fix the upper substrate on the lower surface of the upper chuck.

\* \* \* \* \*